(12) United States Patent
Kim et al.

(10) Patent No.: US 11,339,499 B2
(45) Date of Patent: May 24, 2022

(54) METHOD FOR EPITAXIAL GROWTH OF SINGLE CRYSTALLINE HETEROGENEOUS 2D MATERIALS AND STACKED STRUCTURE

(71) Applicant: KOREA INSTITUTE OF SCIENCE AND TECHNOLOGY, Seoul (KR)

(72) Inventors: Soo Min Kim, Jeollabuk-do (KR); Joo Song Lee, Jeollabuk-do (KR); Hayoung Ko, Jeollabuk-do (KR); Hye Young Koo, Jeollabuk-do (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 16/587,066

(22) Filed: Sep. 30, 2019

(65) Prior Publication Data

US 2020/0109487 A1 Apr. 9, 2020

(30) Foreign Application Priority Data

Oct. 8, 2018 (KR) .................. 10-2018-0119738
Mar. 12, 2019 (KR) .................. 10-2019-0028426

(51) Int. Cl.
| | | |
|---|---|---|
| *C30B 25/18* | (2006.01) | |
| *H01L 21/02* | (2006.01) | |
| *C30B 29/40* | (2006.01) | |
| *H01L 29/20* | (2006.01) | |
| *C30B 29/46* | (2006.01) | |
| *C30B 29/68* | (2006.01) | |

(52) U.S. Cl.
CPC .......... *C30B 25/183* (2013.01); *C30B 29/403* (2013.01); *C30B 29/46* (2013.01); *C30B 29/68* (2013.01); *H01L 21/0254* (2013.01); *H01L 21/0262* (2013.01); *H01L 21/02425* (2013.01);
(Continued)

(58) Field of Classification Search
CPC ..... C30B 25/183; C30B 29/403; C30B 29/60; C30B 29/68; H01L 21/02425; H01L 21/02458; H01L 21/02527; H01L 21/0254; H01L 21/02568; H01L 21/02598;
(Continued)

(56) References Cited

U.S. PATENT DOCUMENTS

| 8,159,037 B2 | 4/2012 | Woo et al. |
| 9,331,198 B2 | 5/2016 | Kelber |
| 10,941,505 B1 * | 3/2021 | Snure ...................... C30B 25/18 |

(Continued)

FOREIGN PATENT DOCUMENTS

| CN | 103227194 A | * | 7/2013 | ............. H01L 21/02 |
| CN | 106206467 A | | 12/2016 | |

(Continued)

OTHER PUBLICATIONS

European Patent Office, English computer translation of CN 103227194 A (Year: 2021).*

(Continued)

*Primary Examiner* — Matthew J Song
(74) *Attorney, Agent, or Firm* — Cantor Colburn LLP

(57) ABSTRACT

Disclosed herein is a method for 2D epitaxial growth comprising: forming a single crystalline h-BN template; forming a plurality of nuclei by depositing a heterogeneous precursor on the h-BN template; and forming a heterogeneous structure layer by growing the plurality of deposited nuclei with a van der Waals epitaxial growth, wherein the heterogeneous structure layer is a single crystal.

5 Claims, 52 Drawing Sheets

(52) U.S. Cl.
CPC .. *H01L 21/02598* (2013.01); *H01L 21/02609* (2013.01); *H01L 29/2003* (2013.01)

(58) Field of Classification Search
CPC .......... H01L 21/02609; H01L 21/0262; H01L 21/02658; H01L 29/2003; H01L 29/1606
See application file for complete search history.

(56) References Cited

U.S. PATENT DOCUMENTS

| | | | |
|---|---|---|---|
| 2015/0214048 A1 | 7/2015 | Suh et al. | |
| 2017/0114450 A1* | 4/2017 | Babenko | C23C 16/01 |
| 2017/0268123 A1* | 9/2017 | Hwang | C30B 23/02 |
| 2019/0097000 A1* | 3/2019 | Berry | H01L 21/02381 |

FOREIGN PATENT DOCUMENTS

| | | |
|---|---|---|
| CN | 108337749 A | 7/2018 |
| JP | 201530648 A | 2/2015 |
| KR | 101490111 B1 | 2/2015 |
| KR | 1020150089840 A | 8/2015 |
| KR | 101692514 B1 | 1/2017 |
| KR | 101865755 B1 | 6/2018 |

OTHER PUBLICATIONS

Hua Yu et al., "Precisely Aligned Monolayer MoS2 Epitaxially Grown on h-BN basal Plane," Small, 2017, 7 pages, vol. 13, No. 1603005.

Mitsuhiro Okada et al., "Direct Chemical Vapor Deposition Growth of WS2 Atomic Layers on Hexagonal Boron Nitride," ACS NANO, 2014, pp. 8273-8277, vol. 8, No. 8, American Chemical Society.

Shanshan Wang et al., "All Chemical Vapor Deposition Growth of MoS2:h-BN Vertical van der Waals Heterostructures," ACS NANO, 2015, pp. 5246-5254, vol. 9, No. 5, American Chemical Society.

Xiaobo Lu, University of Chinese Academy of Sciences, 2017, English Abstract Only, 8 pp.

Toshiaki Hattori et al., Applied Materials & Interfaces, 2016, 33 pp.

* cited by examiner

METHOD FOR EPITAXIAL GROWTH OF SINGLE CRYSTALLINE HETEROGENEOUS 2D MATERIALS AND STACKED STRUCTURE

DESCRIPTION ABOUT NATIONAL SUPPORT RESEARCH AND DEVELOPMENT

This study was supported by following national research project:
Ministry of Science and ICT, Republic of Korea (A study on the mechanism of growth of large area defect-free three-dimensional superlattice structure, Project No. 1711065783) under the superintendence of Korea Institute of Science and Technology.

CROSS-REFERENCE TO RELATED APPLICATION

This application claims priority to and the benefit of Korean Patent Application Nos. 10-2018-119738, filed on Oct. 8, 2018, and 10-2019-28426, filed on Mar. 12, 2019, the disclosure of which is incorporated herein by reference in its entirety.

BACKGROUND OF THE INVENTION

Field of the Invention

Disclosed herein are methods for epitaxial growth of single crystalline heterogeneous 2D materials and stacked structures.

Description of the Related Art

An h-BN thin film is a material excellent thermal and chemical stability and has a hexagonal structure in which boron and nitrogen atoms of an h-BN layer are alternately composed. It resembles to an insulator because electrical conductivity of h-BN is very low due to such a partial ionic structure and has a characteristic that hardness is higher than that of graphite because interlayer interaction is increased.

When the h-BN thin film has a stacked structure as an insulating layer under a 2D conductive material using intrinsic insulating properties, electrical properties of the 2D conductive material are improved.

The h-BN is a material that has potential to be applied to various applications as described above. As a research on the 2D material increases, a gradual and steady increase in a demand for h-BN as an ideal substrate material is expected.

However, in order to make an element composed of a 2D conductive material with h-BN as the insulating layer, it is necessary to have a transfer process in which h-BN is grown by a physical peeling method or a CVD and then transferred on a substrate for the element and another transfer process in which the 2D conductive material is transferred on the element.

In these methods, it is very difficult to match a crystal plane between the 2D conductive material and h-BN, and interlayer impurities generated during the transfer process are likely to remain, thereby causing deterioration in element performance.

Direct growth of the 2D conductive material on an h-BN template results in epitaxial growth in which the 2D conductive material is disposed on a crystal plane of h-BN and no formation of interlayer impurities. Therefore, this may be a solution to the shortcomings of the existing 2D element.

However, a method for epitaxially growing the heterogeneous material in a form of a single crystalline film has not been studied in connection with a technology of growing the 2D heterogeneous material using the h-BN template.

SUMMARY OF THE INVENTION

Embodiments may provide a method for 2D epitaxial growth in a large area, single crystalline 2D h-BN template.

Embodiments may provide a method for directly growing a heterogeneous 2D material on an h-BN template without a transferring process.

Embodiments may provide a method for growth of a single crystalline heterogeneous 2D material that is not affected by unnecessary impurities and oxidation from an outside.

In accordance with one aspect of the present invention, there is provided a method for 2D epitaxial growth comprising: forming a single crystalline h-BN template; forming a plurality of nuclei by depositing a heterogeneous precursor on the h-BN template; and forming a heterogeneous structure layer with a van der Waals epitaxial growth of the plurality of deposited nuclei wherein the heterostructure layer is a single crystal.

In an exemplary embodiment, the plurality of deposited nuclei may be oriented in one direction.

In an exemplary embodiment, the heterogeneous precursor may comprise one or more of methane ($CH_4$), ethane ($C_2H_6$) and ethyne ($C_2H_2$), or metal oxide ($MO_3$) and chalcogen (X), where the M may be Mo or W and the X may be S, Se, or Te.

In an exemplary embodiment, the deposition may be performed by any one deposition method selected from a group consisting of organometallic chemical vapor deposition (MOCVD), plasma chemical vapor deposition (PECVD) and atomic layer deposition (ALD).

In an exemplary embodiment, the method for growth may wherein the method directly grows the heterogeneous structure layer continuously on the h-BN template immediately after forming the single crystalline h-BN template.

In an exemplary embodiment, the heterogeneous structure layer may comprise any one of graphene and transition metal chalcogenide compound ($MX_2$), where the M may comprise molybdenum (Mo) or titanium (Ti) and the X may comprise sulfur (S), selenium (Se), or telenium (Te).

In an exemplary embodiment, the forming the heterogeneous structure layer may comprise heat treatment at a temperature of 600° C. to 1,200° C.

In an exemplary embodiment, the forming the single crystalline h-BN template may comprise stacking a second substrate on a first substrate; heating a stacked substrate to a melting temperature or higher of the second substrate; and forming a single crystalline h-BN template on the second substrate.

In an exemplary embodiment, a melting temperature of the first substrate may be higher than a melting temperature of the second substrate.

In an exemplary embodiment, the first substrate may be one or more metals selected from a group consisting of zirconium (Zr), chromium (Cr), vanadium (V), rhodium (Rh), molybdenum (Mo), tantalum (Ta) and tungsten (W), or an alloy thereof, and the second substrate may be one or more metals selected from a group consisting of gold (Au), copper (Cu), iron (Fe), manganese (Mn), nickel (Ni), cobalt (Co), palladium (Pd), titanium (Ti) and platinum (Pt), or an alloy thereof.

In accordance with another aspect of the present invention, there is provided a stacked structure comprising a single crystalline h-BN template and a heterogeneous structure layer, wherein the single crystalline h-BN template and the heterogeneous structure layer are stacked with a van der Waals force and the heterogeneous structure layer is a single crystal.

In an exemplary embodiment, the single crystalline h-BN template and the heterogeneous structure layer may be stacked in an AA'-stacking.

In an exemplary embodiment, the heterostructure layer may comprise any one of graphene and transition metal chalcogenide compound ($MX_2$), where the M may comprise molybdenum (Mo) or tungsten (W) and the X may comprise sulfur (S), selenium (Se), or telenium (Te).

In an exemplary embodiment, the stacked structure may be applied to a transistor, a gas/water blocking film, or a semiconductor device.

DETAILED DESCRIPTION OF THE PREFERRED EMBODIMENTS

Hereinafter, embodiments of the present invention will be described in more detail.

The embodiments of the present invention disclosed in the specification are illustrated for explanatory purposes only, and the embodiments of the present invention may be embodied in various forms and should not be construed as being limited to the embodiments described in the specification.

The present invention may be modified in various ways and may have various forms, and the embodiments are not intended to limit the present invention to specific disclosed forms. It is to be understood that all changes, equivalents, and substitutes included in the spirit and scope of the present invention are included in the present invention.

Figure 1:
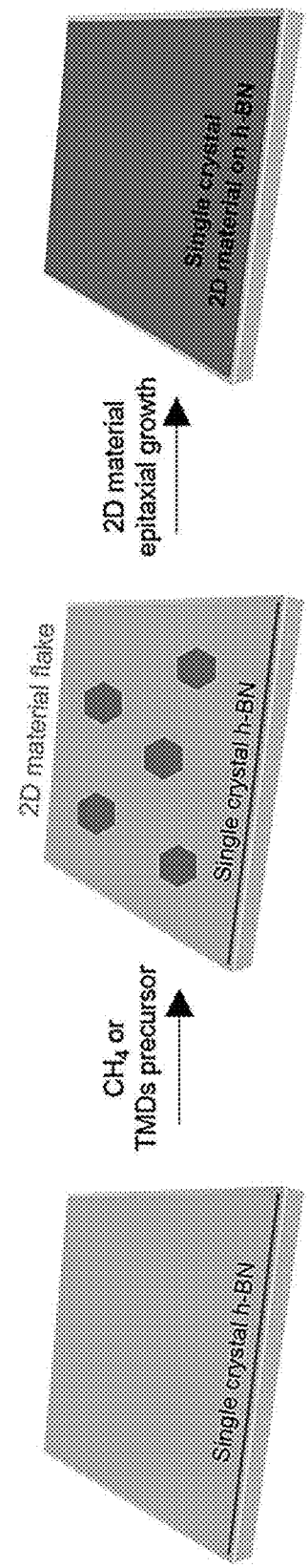
FIG. 1 illustrates a method for an epitaxial growth of a 2D heterogeneous material according to an embodiment of the present invention, and illustrates a method for forming graphene and a heterogeneous structure layer on an h-BN template.
Figure 2:
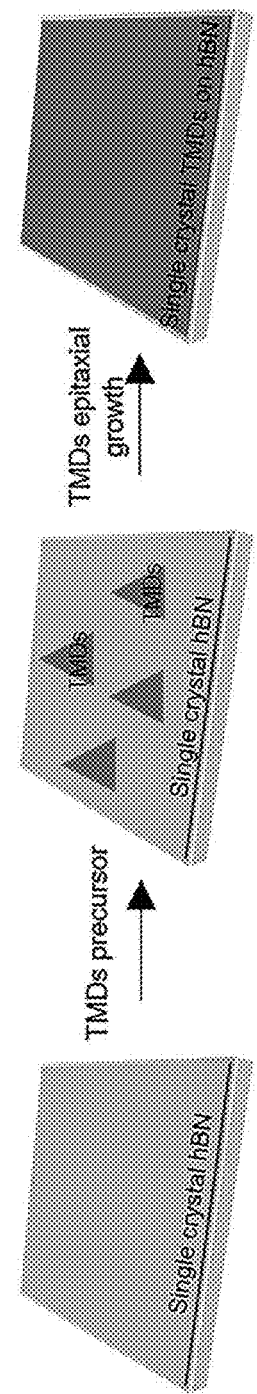
FIG. 2 illustrates a method for the epitaxial growth of the 2D heterogeneous material according to an embodiment of the present invention, and illustrates a method for forming TMDs and the heterogeneous structure layer on the h-BN template.

Hereinafter, each step according to the present invention will be described in detail with reference to a method for 2D epitaxial growth illustrated in FIGS. 1 and 2.

In an embodiment of the present invention, there is provided the method for 2D epitaxial growth comprising forming a single crystalline h-BN template; forming a plurality of nuclei by depositing a heterogeneous precursor on the h-BN template; and forming a heterogeneous structure layer by growing the plurality of deposited nuclei with a van der Waals epitaxial growth, in which the heterogeneous structure layer is a single crystal.

Step of Forming Single Crystalline h-BN Template

In an embodiment, the method for 2D epitaxial growth may comprise the step of forming the single crystalline h-BN template.

In an embodiment, the step of forming the single crystalline h-BN template may comprise a step of stacking a second substrate on a first substrate; a step of heating a stacked substrate at a melting temperature or higher of the second substrate; and a step of forming an h-BN template on the second substrate.

In an embodiment, a metal capable of being used as the first substrate and the second substrate may be one or more metals selected from a group consisting of zirconium (Zr), chromium (Cr), vanadium (V), rhodium (Rh), molybdenum (Mo), tantalum (Ta), tungsten (W), gold (Au), copper (Cu), iron (Fe), manganese (Mn), nickel (Ni), cobalt (Co), palladium (Pd), titanium (Ti) and platinum (Pt), or an alloy thereof.

Preferably, in the selection of the first substrate and the second substrate, any combination of metals may be used, in which a melting temperature of the first substrate is higher than a melting temperature of the second substrate.

More preferably, the melting temperature of the first substrate is 1,800° C. or higher, the melting temperature of the second substrate may be in a range of 1,000 to 1,800° C.

In an embodiment, the first substrate may be one or more metals selected from a group consisting of zirconium (Zr), chromium (Cr), vanadium (V), rhodium (Rh), molybdenum (Mo), tantalum (Ta) and tungsten (W), or an alloy thereof. The second substrate may be one or more metals selected from a group consisting of gold (Au), copper (Cu), iron (Fe), manganese (Mn), nickel (Ni), cobalt (Co), palladium (Pd), titanium (Ti) and platinum (Pt), or an alloy thereof.

In an embodiment, the melting temperature of the first substrate may be higher than the melting temperature of the second substrate.

Table 1 below illustrates types of metals that can be used as the first substrate and the melting temperatures of the metals, and Table 2 illustrates types of metals that can be used as the second substrate and the melting temperatures of the metals.

TABLE 1

| | First Substrate | | | | | | |
| --- | --- | --- | --- | --- | --- | --- | --- |
| | Zr | Cr | V | Rh | Mo | Ta | W |
| Melting Temperature (° C.) | 1,854 | 1,860 | 1,900 | 1,965 | 2,620 | 2,980 | 3,400 |

TABLE 2

| | Second Substrate | | | | | | | | |
| --- | --- | --- | --- | --- | --- | --- | --- | --- | --- |
| | Au | Cu | Fe | Mn | Ni | Co | Pd | Ti | Pt |
| Melting Temperature (° C.) | 1,063 | 1,084 | 1,150 | 1,244 | 1,453 | 1,495 | 1,555 | 1,670 | 1,770 |

In an embodiment, gold (Au) as the second substrate, which is a metal catalyst for preparing h-BN, is melted when being heated to a melting temperature of 1,063° C. or higher to change a shape thereof into a spherical shape capable of minimizing surface tension.

In an embodiment, the step of stacking the second substrate on the first substrate may be a step of stacking a sheet formed of one or more metals selected from a group consisting of gold (Au), copper (Cu), iron (Fe), manganese (Mn), nickel (Ni), cobalt (Co), palladium (Pd), titanium (Ti), and platinum (Pt), or an alloy thereof, which is the second substrate, on a sheet formed of one or more metals selected from a group consisting of zirconium (Zr), chromium (Cr), vanadium (V), rhodium (Rh), molybdenum (Mo), tantalum (Ta), and tungsten (W), or an alloy thereof, which is the first substrate.

In an embodiment, the step of heating the stacked substrate at the melting temperature or higher of the second substrate may be a step of heating the stacked substrate to a melting temperature of one or more metals selected from a group consisting of gold (Au), copper (Cu), iron (Fe), manganese (Mn), nickel (Ni), cobalt (Co), palladium (Pd), titanium (Ti), and platinum (Pt), or an alloy thereof, which is the second substrate. Here, when the second substrate is heated to the melting temperature or higher, a shape of the second substrate changes from a plate-like sheet shape to a spherical shape. When the second substrate is stacked, to be heated, on the first substrate corresponding to a supporting member, the shape does not change to the spherical shape, and a phase changes from a solid state to a liquid state while maintaining the plate-like shape.

That is, in gold (Au) which is a catalyst used in an embodiment of the present invention, a limit thereof where gold (Au) is in a liquid state at a melting point or higher and does not maintain the shape thereof may be stably supported by a tungsten substrate as the first substrate. Therefore, h-BN of a single crystalline single layer having a large area can be grown on the surface of the liquid second substrate and can be prepared with excellent reproducibility as a uniform sheet shape in an atomic thickness.

In addition, a nitrogen source and a boron source can be easily adsorbed onto the surface of the liquid second substrate due to a high surface tension. In particular, the solubility of B atoms and N atoms on the surface of the liquid second substrate, such as a surface of liquid gold, may be ~0.5 and ~0 atomic %, respectively, so that the B atoms and N atoms may have surface diffusion rather than bulk diffusion. On the other hand, a degree of diffusion of surface atoms can affect a shape of crystal grains to be formed. For example, the h-BN crystal grains formed on the liquid second substrate may be circular or hexagonal.

In an embodiment, the step of forming the single crystalline h-BN template on the second substrate may be a step of forming the h-BN thin film on the second substrate by a chemical vapor deposition method using gaseous nitrogen supply source and boron supply source, in which the second substrate is in the sheet shape in a liquid state on the first substrate at a temperature or higher of the melting temperature of the second substrate.

Figure 16:
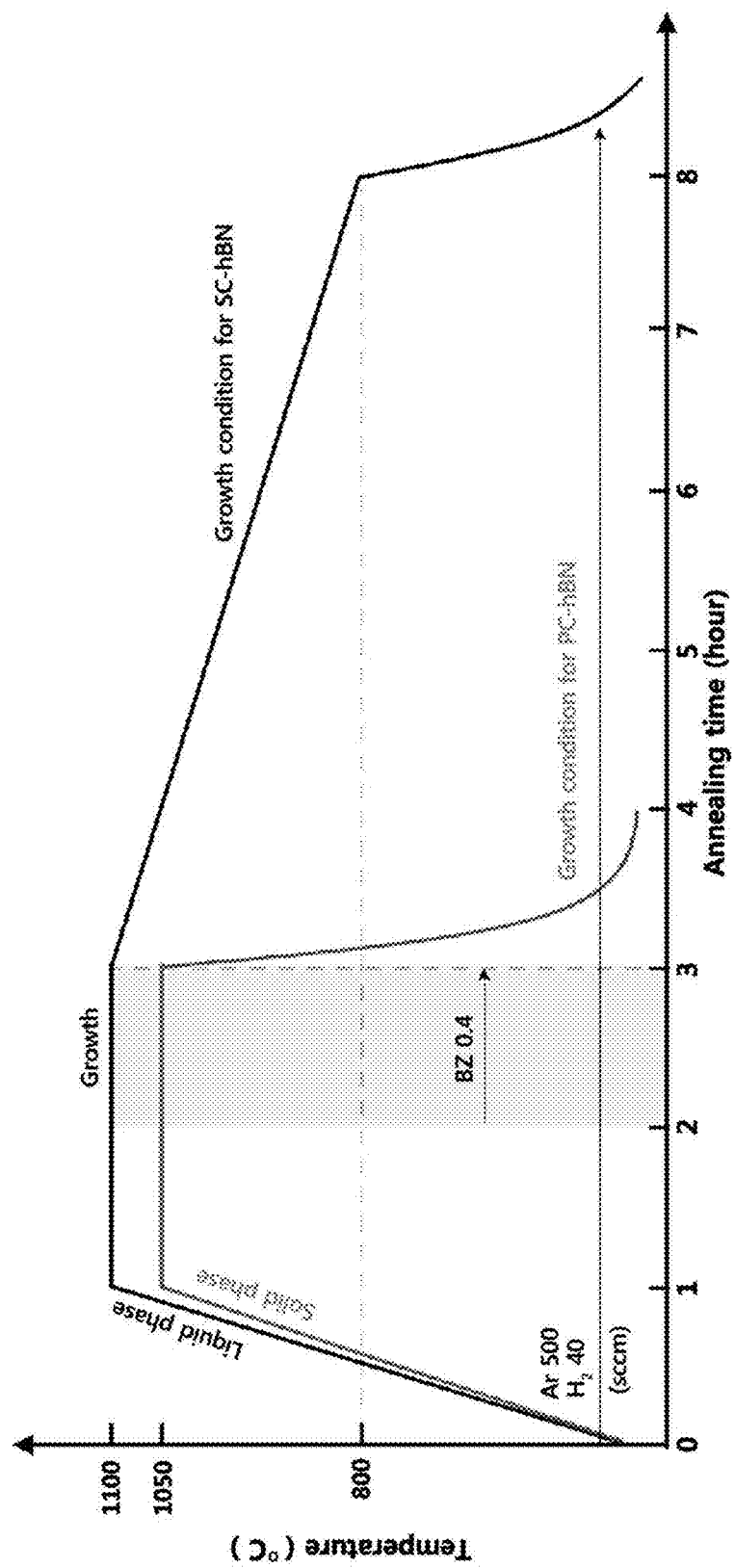
FIG. 16 illustrates a comparison between growth processes of single crystalline h-BN and polycrystalline h-BN.
Figure 24:
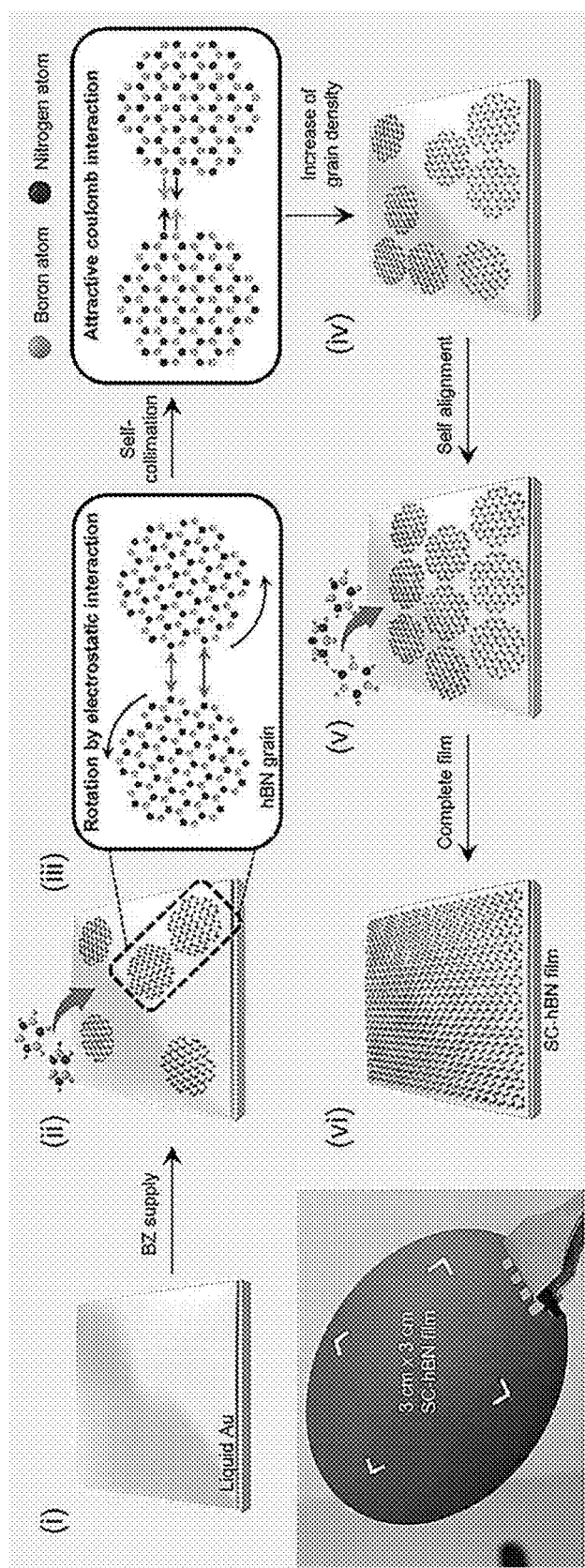
FIG. 24 schematically illustrates a step of forming an h-BN template on a second substrate.
Figure 25A:
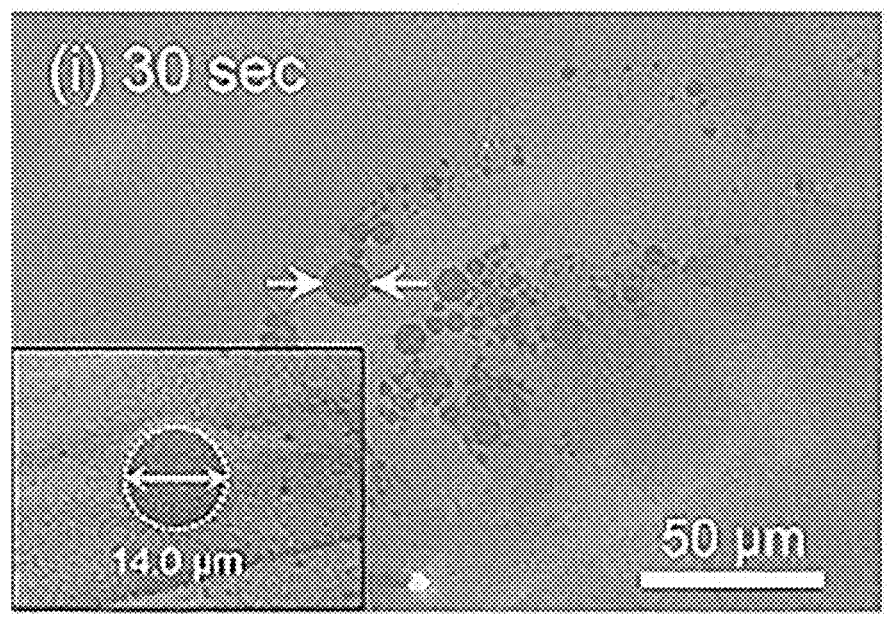
FIGS. 25A to 25F illustrate a crystal grain size and an arrangement of h-BN, and a final film formation with an increase in growth time and two-step precursor supply.
Figure 25B:
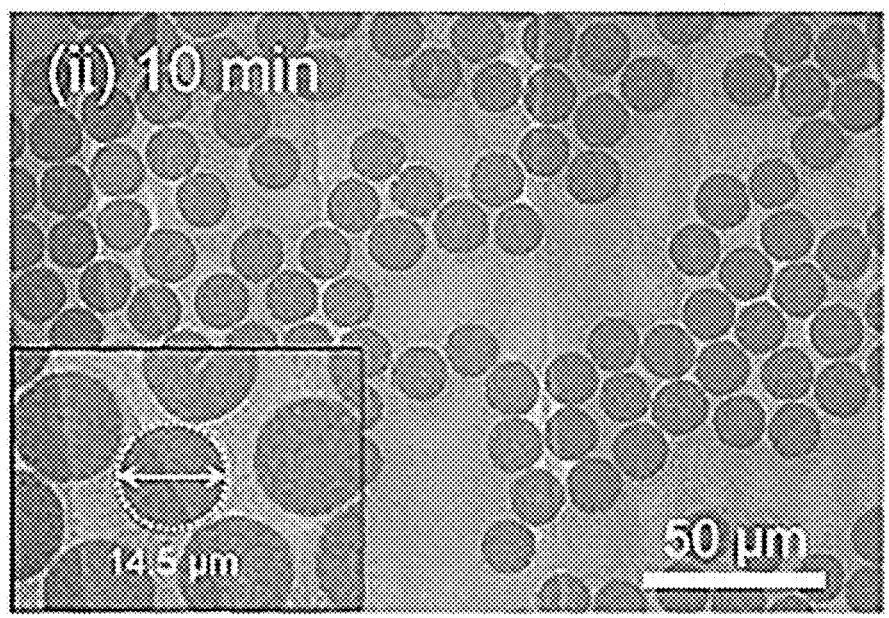
Figure 25C:
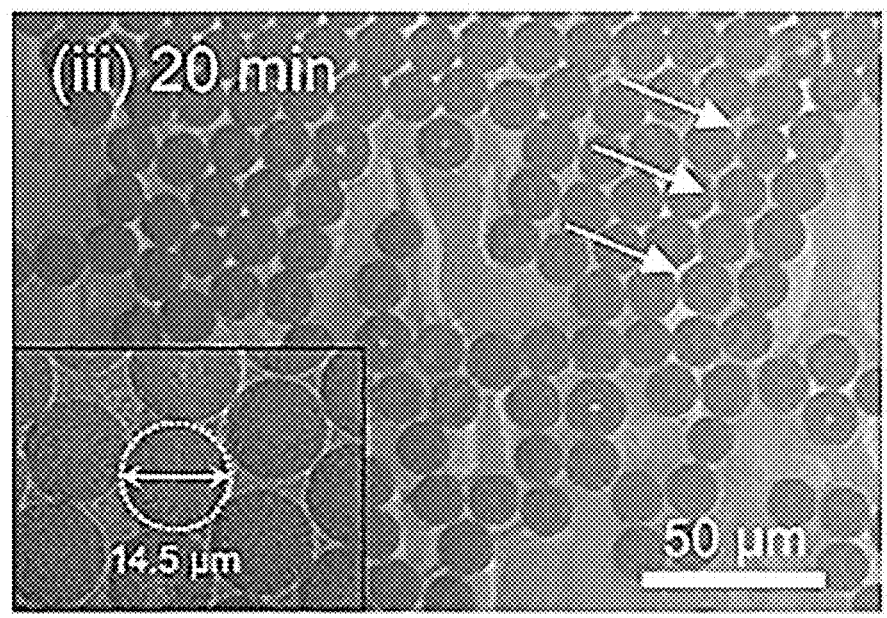
Figure 25D:
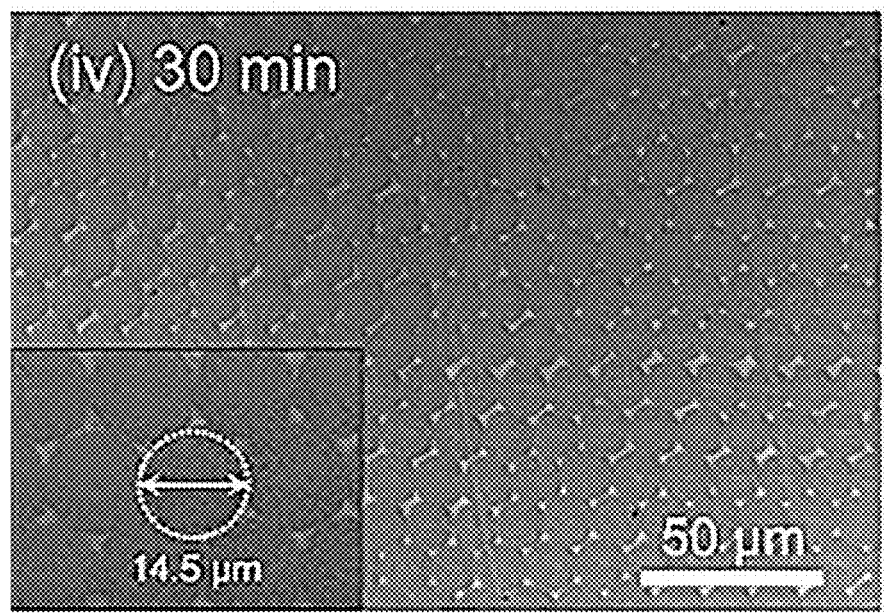
Figure 25E:
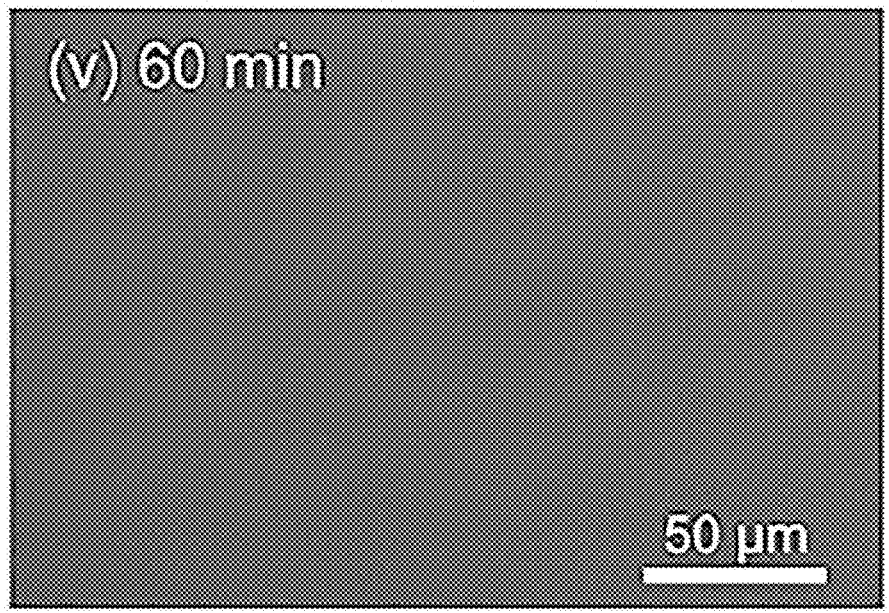
Figure 25F:
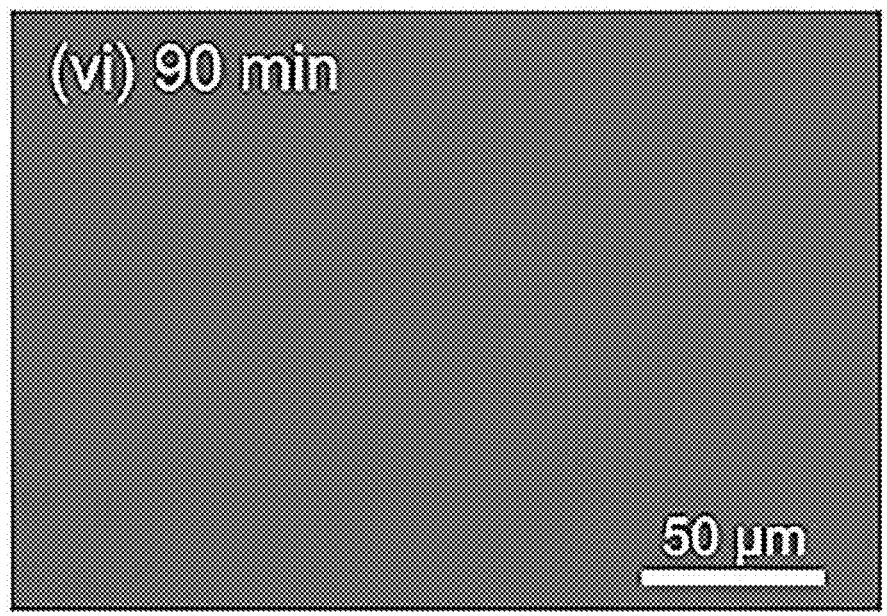

In an embodiment, the step of forming the h-BN template on the second substrate may comprise a step of supplying the nitrogen source and the boron source at a constant flow rate, forming h-BN nuclei on the second substrate, and growing the h-BN crystal grains; a step of self-aligning the h-BN crystal grains; and a step of merging adjacent h-BN crystal grains and forming the h-BN template. FIG. 24 schematically illustrates the step of forming the h-BN template on the second substrate, and FIG. 16 illustrates a comparison of growing processes of single crystalline h-BN and polycrystalline h-BN.

First, the nitrogen source and the boron source are supplied at a constant flow rate to form the h-BN nuclei on the second substrate and the h-BN nuclei can grow into the h-BN crystal grains.

In an embodiment, the h-BN crystal grains may be a size of 15 μm or less in diameter, and the size may vary depending on the atmosphere (for example, $H_2$) or supply conditions of the nitrogen source and the boron source (for example, borazine).

Figure 17:
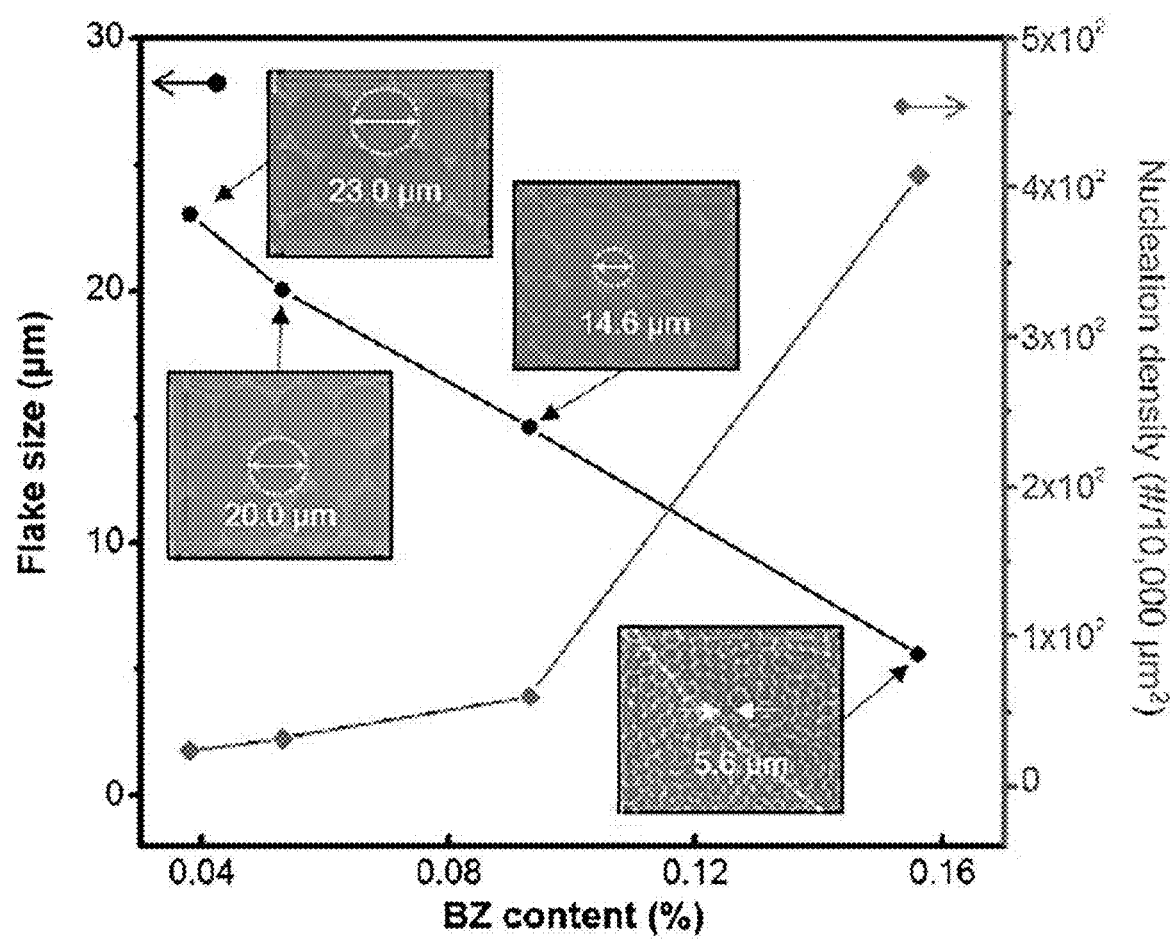
FIG. 17 illustrates a crystal grain size and a nucleation density per unit area of h-BN according to a concentration of borazine for a carrier gas (argon+hydrogen)

For example, if the nitrogen source and the boron source are borazine, borazine may be supplied with a concentration in a range of 0.05 to 0.15 vol % based on a total volume of inert gas and hydrogen gas, preferably in a range of 0.08 to 0.12 vol %. At the concentration of the borazine below 0.05 vol %, the diameter of the h-BN crystal grains may be too large to form a single crystalline film, and at the concentration above 0.15 vol %, the nucleation density per unit area increases, thereby forming smaller sized h-BN crystal grains. FIG. 17 illustrates the crystal grain size and nucleation density per unit area according to the concentration of the borazine as the nitrogen source and the boron source.

In an embodiment, the gaseous nitrogen source and boron source can be supplied at a constant flow rate and can be supplied in an inert atmosphere or in a reducing atmosphere. The inert atmosphere uses an inert gas such as argon or helium, and the reducing atmosphere may be formed by using a hydrogen gas. For example, the inert atmosphere (inert gas) or the reducing atmosphere (hydrogen gas) may act as a carrier gas.

In an embodiment, the gaseous nitrogen source and boron source can be supported in an atmosphere formed by using an inert gas (for example, argon) and hydrogen gas. Specifically, the inert gas and hydrogen may be supplied at a specific volume ratio to form an atmosphere, for example the atmosphere can be formed at a volume ratio of 500:1-200, 500:10-200, 500:20-100, 500:30-100, 500:40-100, 700:1-200, or 1000:1-20. When the volume ratio of inert gas to hydrogen is less than 500:1, the size of h-BN crystal grains is small, the nucleation density per unit area may be excessively high, and when the volume ratio of inert gas to hydrogen is more than 500:200, the h-BN crystal grain formation may be difficult. FIG. 21 illustrates the formation of h-BN with different argon and hydrogen volume ratios.

Figure 22:
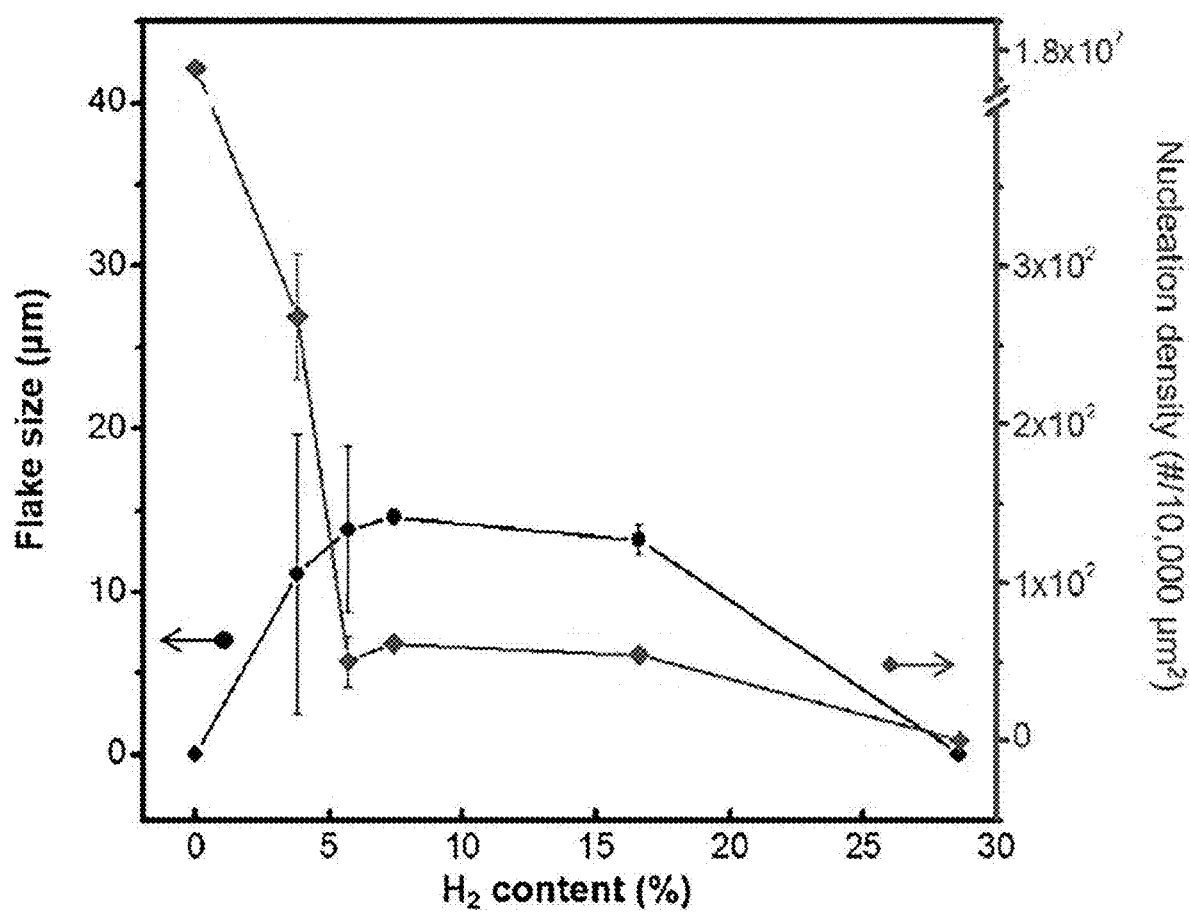
FIG. 22 illustrates a crystal grain size and nucleation density per unit area in accordance with a hydrogen atmosphere.
Figure 23A:
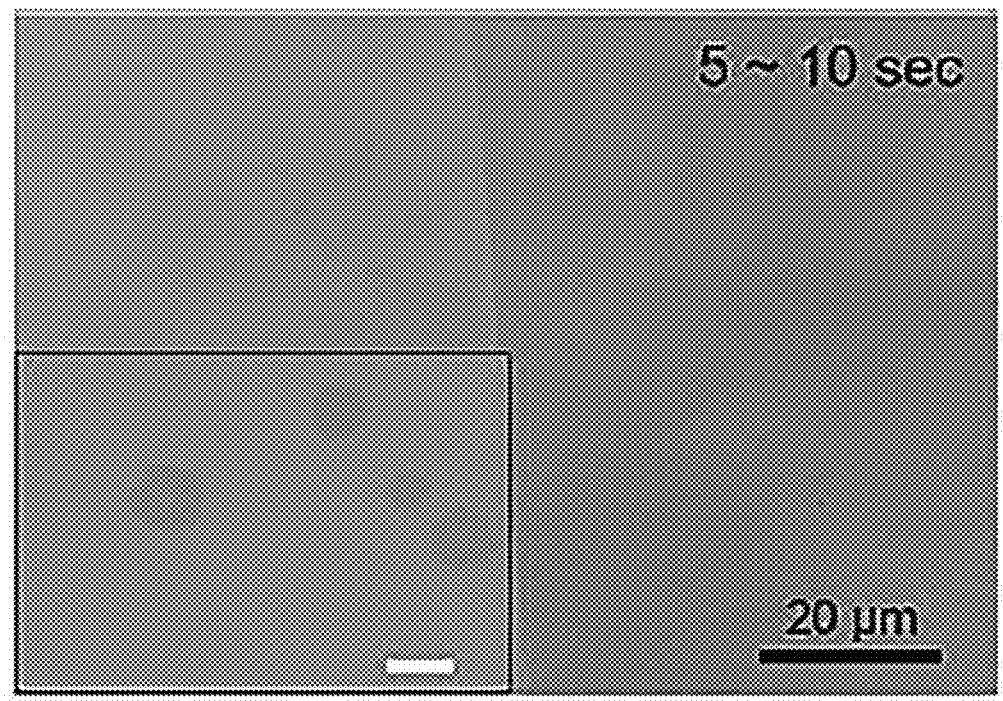
FIGS. 23A to 23H illustrate a crystal grain size and an arrangement degree of h-BN with an increase in growth time.
Figure 23B:
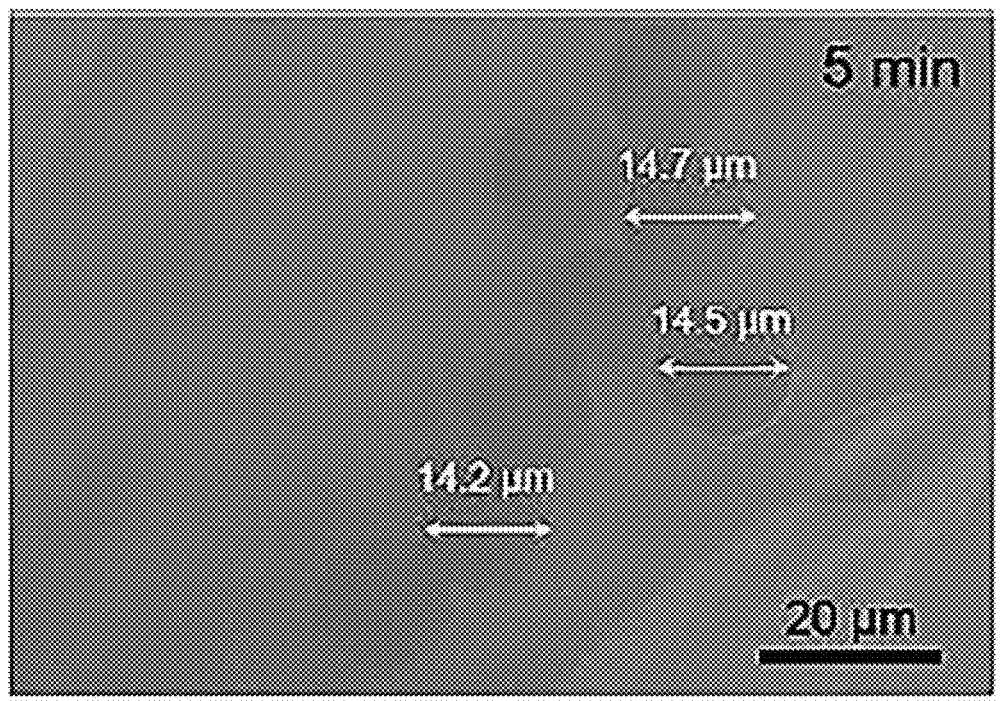
Figure 23C:
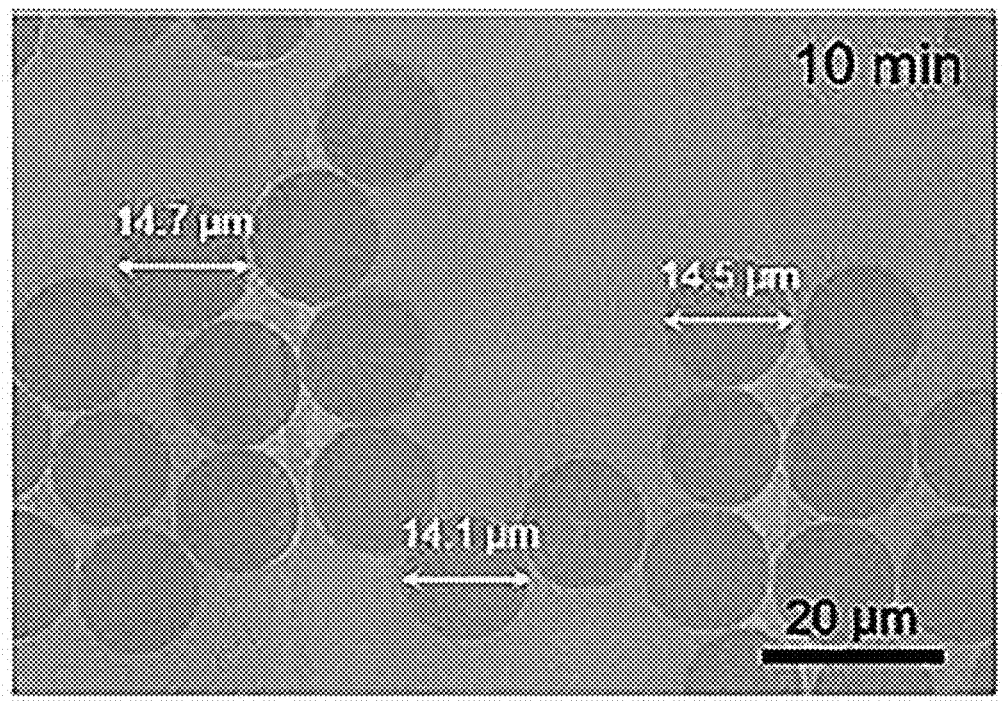
Figure 23D:
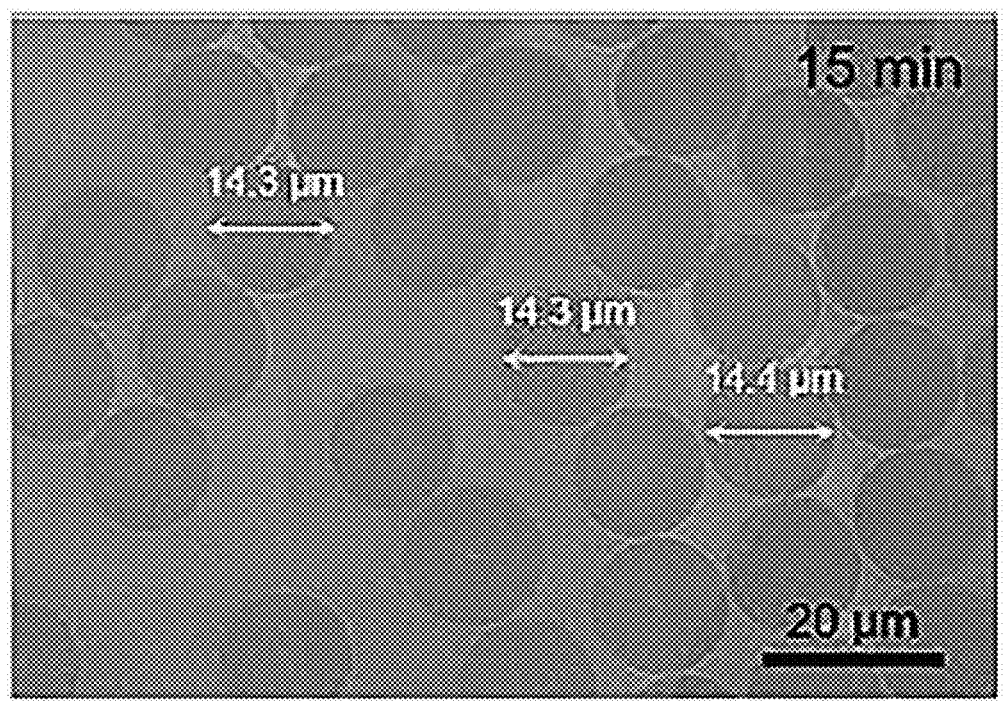
Figure 23E:
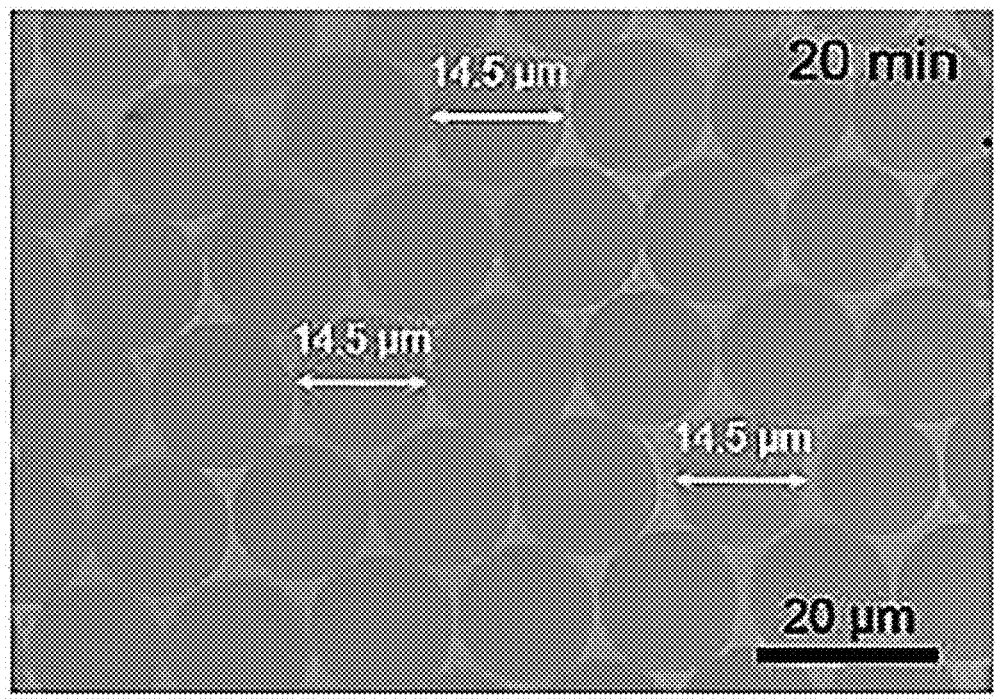
Figure 23F:
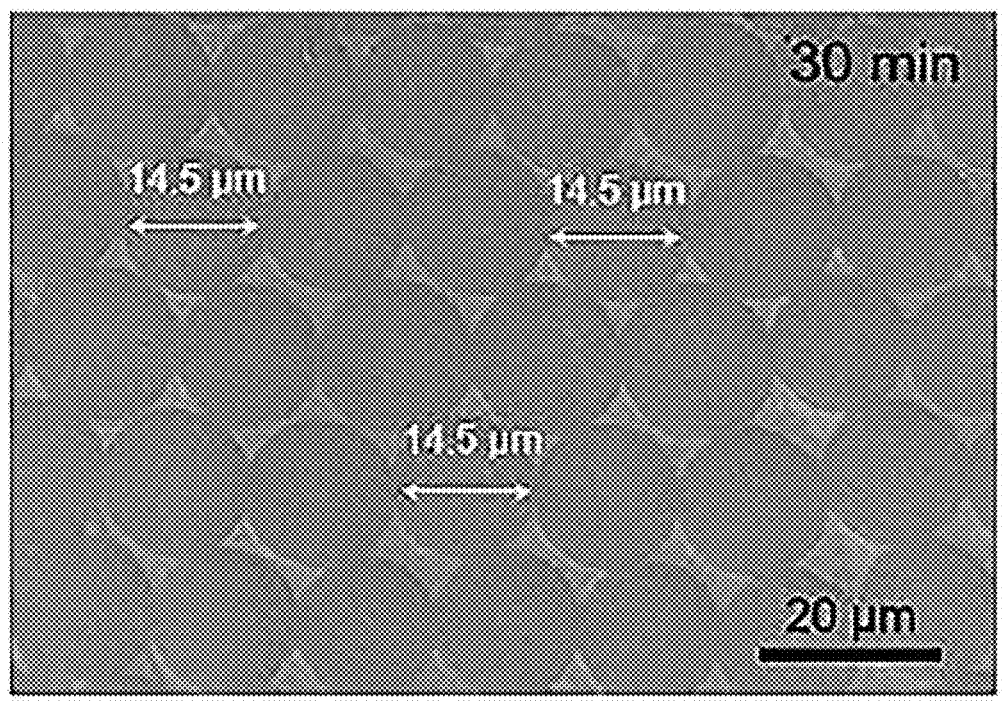
Figure 23G:
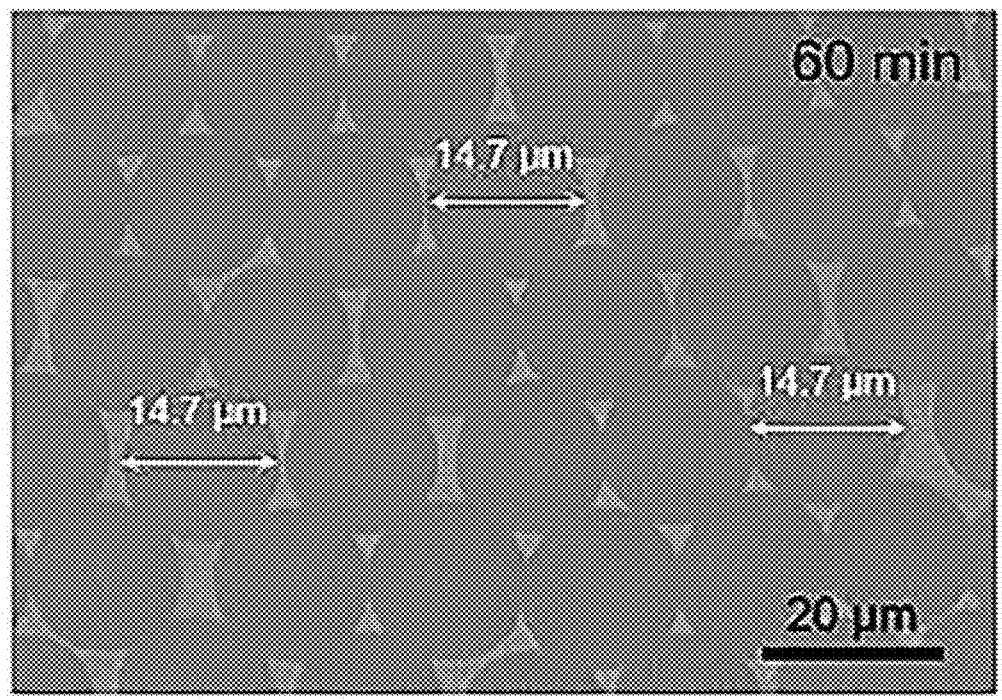
Figure 23H:
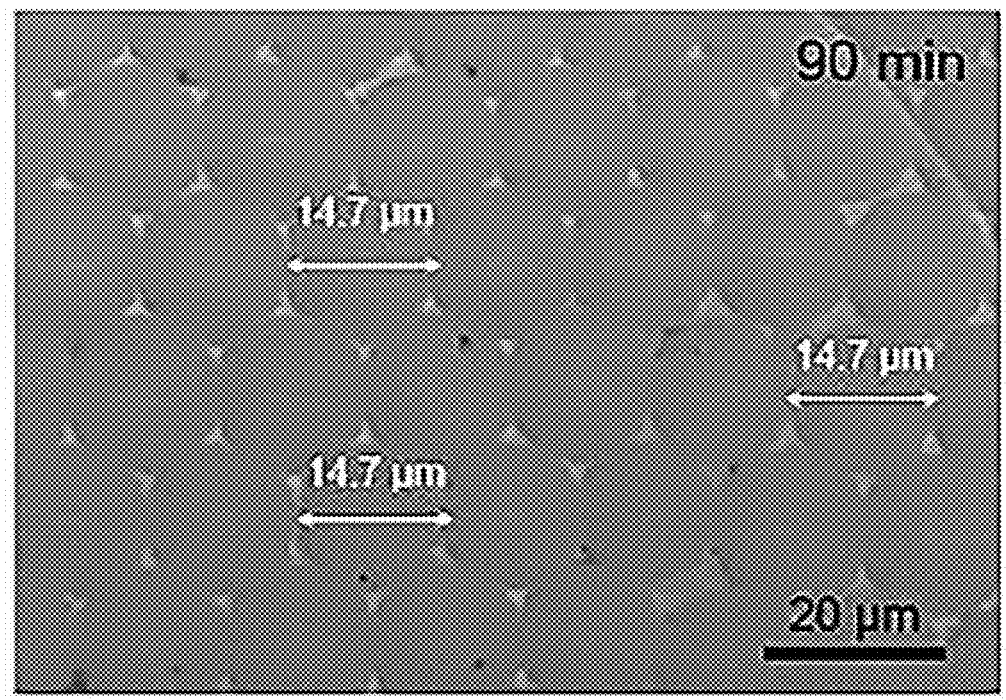

For example, the hydrogen atmosphere may be supplied in a range of 5-30 vol % based on the total volume of the inert gas and the hydrogen gas, preferably in a range of 5-15 vol %. When the hydrogen atmosphere is supplied at less than 5 vol %, the nucleation density per unit area may be too high, and when it is more than 30 vol %, crystal grain formation may be difficult. FIG. 22 illustrates the crystal grain size and nucleation density per unit area in accordance with the hydrogen atmosphere.

Here, the nitrogen source is not particularly limited as long as it can supply the nitrogen element in the gas phase, and may comprise one or more selected from $NH_3$, $N_2$, and the like. Further, the boron source is not particularly limited as long as it can supply boron element in the gas phase, and may comprise one or more selected from $BH_3$, $BF_3$, $BCl_3$, $B_2H_6$, $(CH_3)_3B$, $(CH_3CH_2)_3B$, a borazine-based compound, and the like.

In addition, the nitrogen source and the boron source need only be supplied in a gas phase, and a raw material itself does not need to be in the gas phase, and it is also possible to vaporize the solid nitrogen and a boron-containing material in an external container. An ammonia-borane ($NH_3$—$BH_3$) compound can be used as the solid-phase nitrogen and boron supply sources stored in an external container.

In an embodiment, borazine ($H_3B_3N_3H_3$) may be used as the nitrogen source and the boron source, which are precursors of h-BN to prepare the h-BN template. Here, borazine is a kind of unsaturated boron nitride having a hexagonal structure similar to h-BN having three nitrogen atoms and three boron atoms in a molecule, and having a melting point of −58° C. and a boiling point of 55° C. Therefore, since borazine exists in a liquid state at room temperature, it may be preferable to use borazine maintained at a temperature of minus 10° C. by using a refrigerator, so that a vapor pressure is kept constant without being affected by the temperature. At temperatures below zero, borazine does not readily vaporize, so that a tube is connected into the liquid borazine to add hydrogen. Therefore, if diluted borazine is supplied in a gaseous state and used as a precursor for the preparation of the h-BN template, there is an advantage that it is easier to control the flow rate than a different precursor in solid state and solid impurities are not generated.

In an embodiment, if borazine ($H_3B_3N_3H_3$) is used as the nitrogen source and the boron source, the concentration of borazine can determine the size of the h-BN crystal grains. For example, as the concentration of borazine increases, the nucleation density per unit area in the h-BN crystal grains may increase, and smaller size h-BN crystal grains may be formed. However, when the size of the h-BN crystal grains is too small, many defects may be included in the formed h-BN.

In an embodiment, the h-BN nuclei formed on the second substrate can be grown to h-BN crystal grains for 10 to 90 minutes, preferably for 30 to 60 minutes. If the h-BN nuclei are grown for less than 10 minutes, the crystal grain formation may not be sufficient, and if the h-BN nuclei are grown for more than 90 minutes, a growth degree according to the growth time may not be large. As can be seen in FIGS. 23 and 25, it can be confirmed that an increase width of an amount of crystal grains is not large after the growth time is 60 minutes.

Next, the formed h-BN crystal grains can be self-aligned.

Figure 18A:
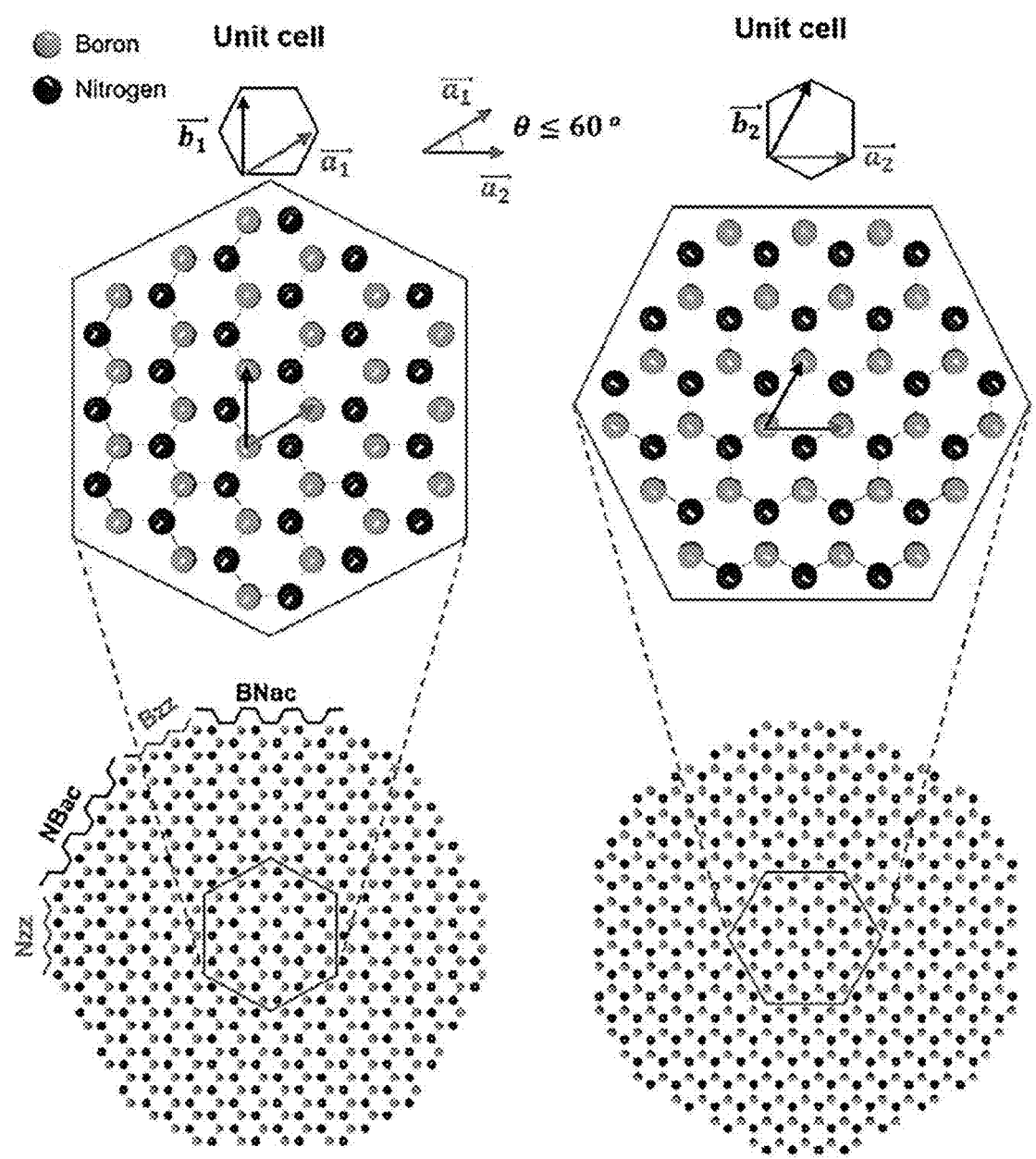
FIGS. 18A and 18B illustrate schematic views of a self-alignment phenomenon in which adjacent h-BN crystal grains interact with each other to make a self-alignment.

In an embodiment, the h-BN crystal grains may have a specific atomic arrangement structure, for example, an arrangement structure of B atoms and N atoms. For example, the h-BN crystal grains may have a zigzag or armchair arrangement at peripheries thereof, for example, may have B-zigzag (Bzz), N-zigzag (Nzz), BN-armchair (BNac), or NB-armchair (NBac) atomic arrangement. Here, the B-zigzag (Bzz) and the N-zigzag (Nzz) refer to arrangements in which outermost atoms are B and N, respectively, and the BN-armchair (BNac) and the NB-armchair (NBac) refer to zigzag arrangements in which atom arrangement orders are, respectively, . . . B—N—B—N—B—N—B . . . , and . . . N—B—N—B—N—B—N, and are specifically illustrated in FIG. 18a.

Figure 18B:
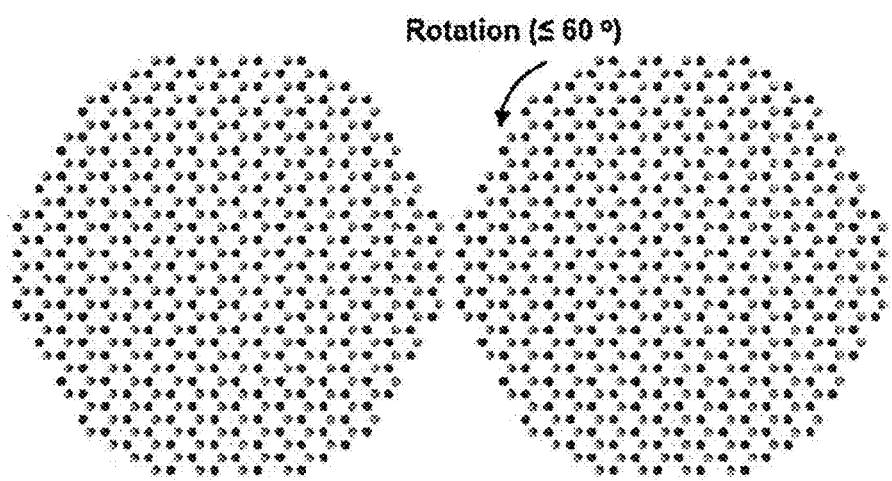
Figure 18B:
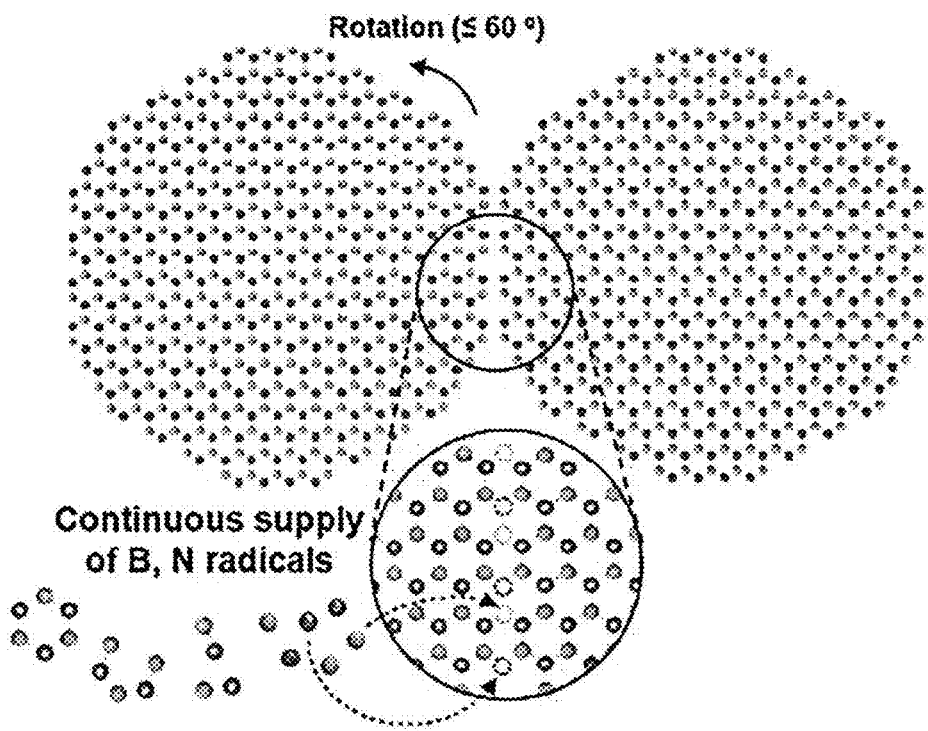

In an embodiment, in the step of self-aligning, the h-BN crystal grains may be self-aligned by interacting with adjacent h-BN crystal grains. Specifically, the self-alignment may be performed by interacting the N-zigzag (Nzz) in the peripheries of the h-BN crystal grains with the B-zigzag (Bzz) in the peripheries of the adjacent h-BN crystal grains. Further, for example, the self-alignment may be performed by interacting the BN-armchair (BNac) in the peripheries of the h-BN crystal grain and with the NB-armchair (NBac) outside the adjacent h-BN crystal grains, and are specifically illustrated in FIG. 18b. When the NB-armchair (NBac) and the NB-armchair (NBac), or the BN-armchair (BNac) and the BN-armchair (BNac) meet each other, binding therebetween may be induced by supplying additional B and N radical sources.

Figure 19:
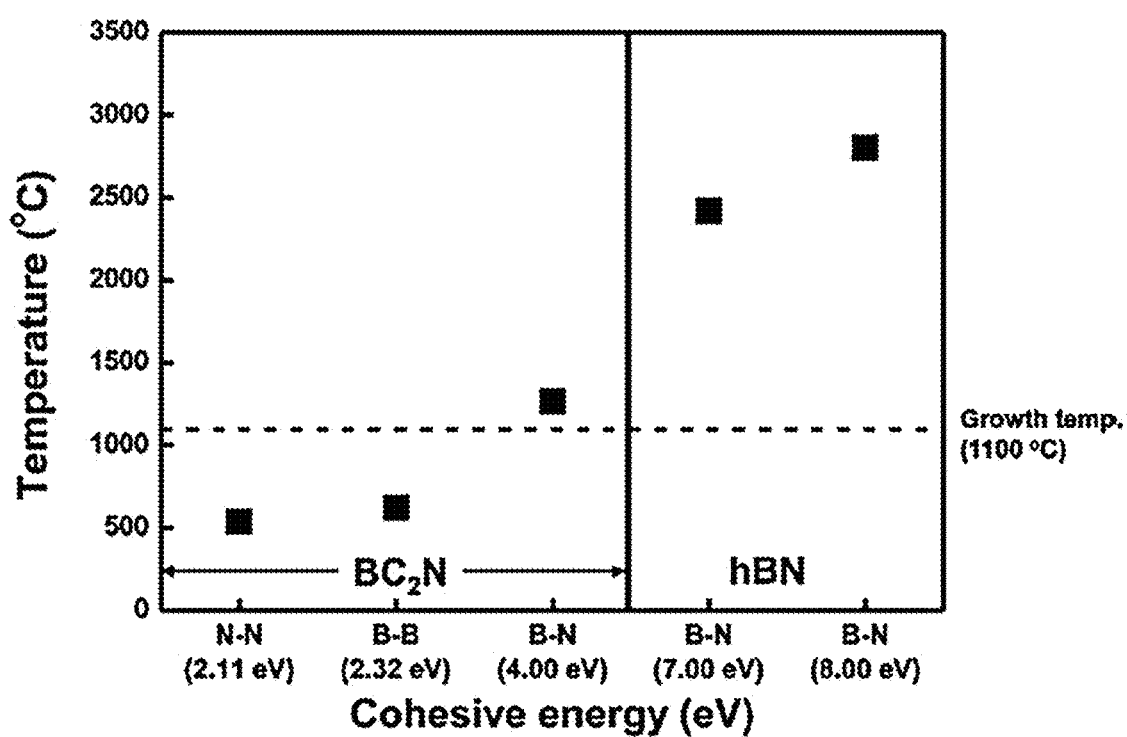
FIG. 19 illustrates a graph comparing cohesive energy of B—B bonding and N—N bonding with cohesive energy of B—N bonding.
Figure 20A:
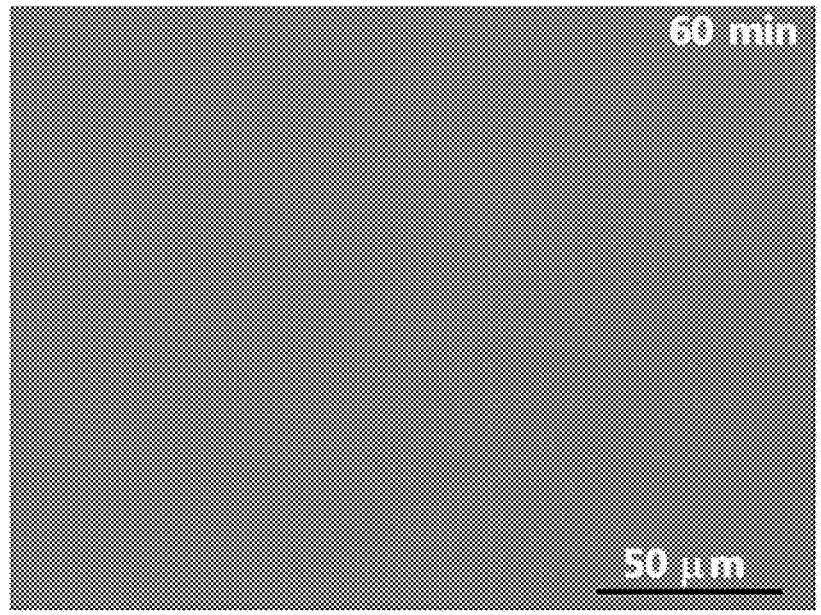
FIGS. 20A to 20D illustrate a monolayer h-BN thin film with two stage growth times.
Figure 20B:
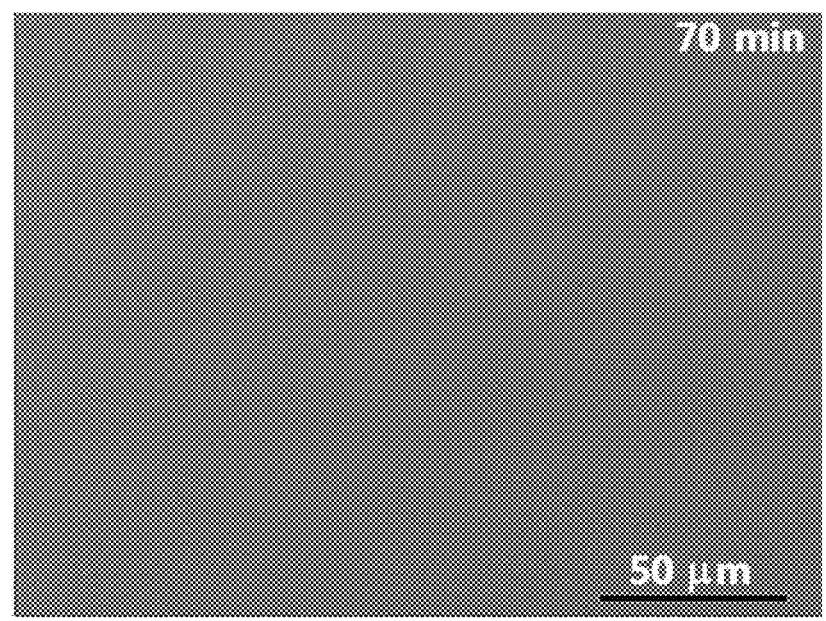
Figure 20C:
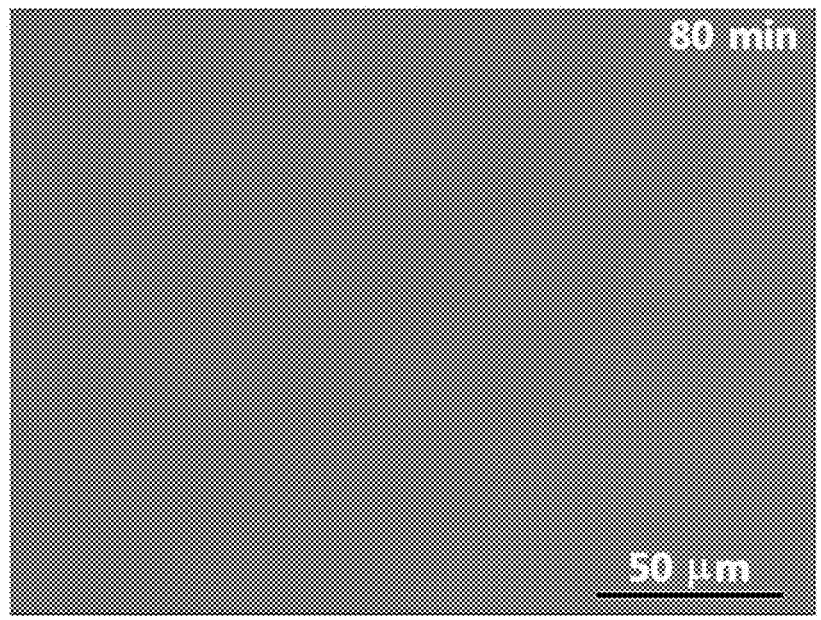
Figure 20D:
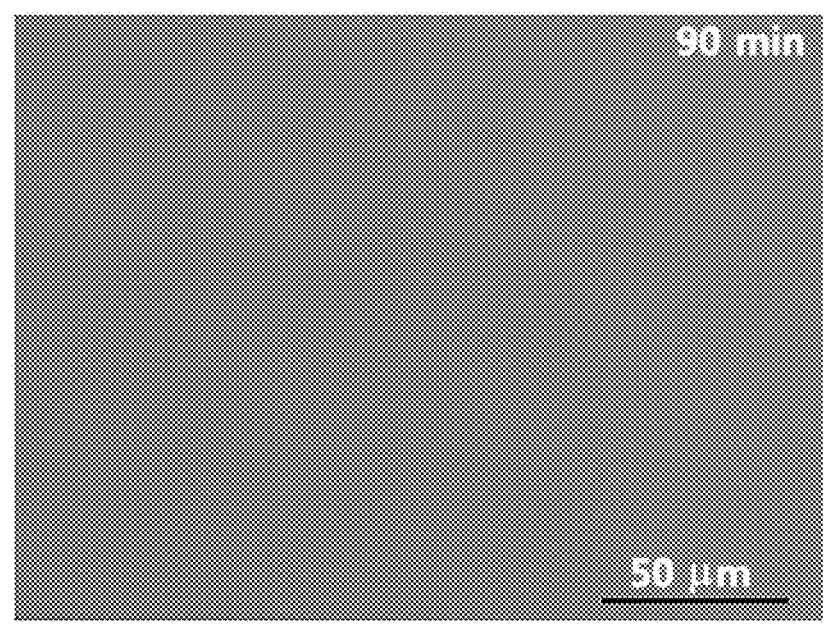
Figure 21A:
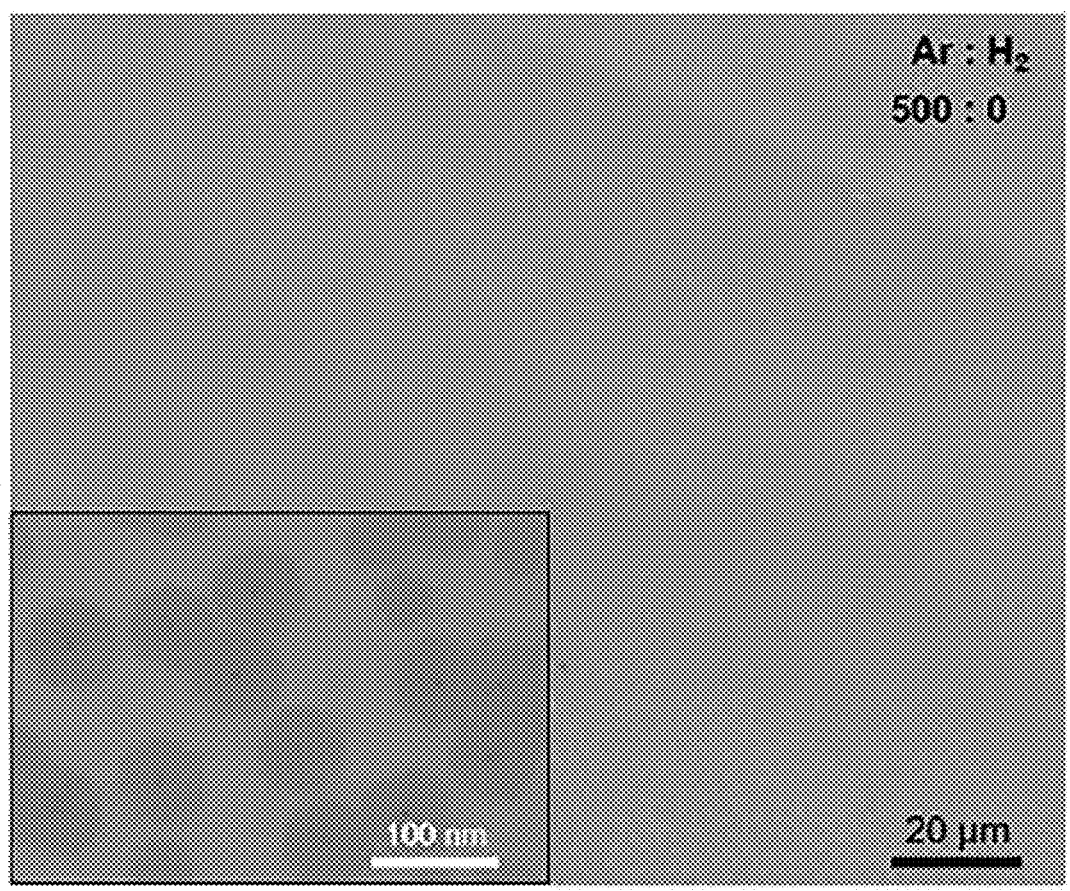
FIGS. 21A to 21F illustrate a formation of h-BN with different argon and hydrogen ratios.
Figure 21B:
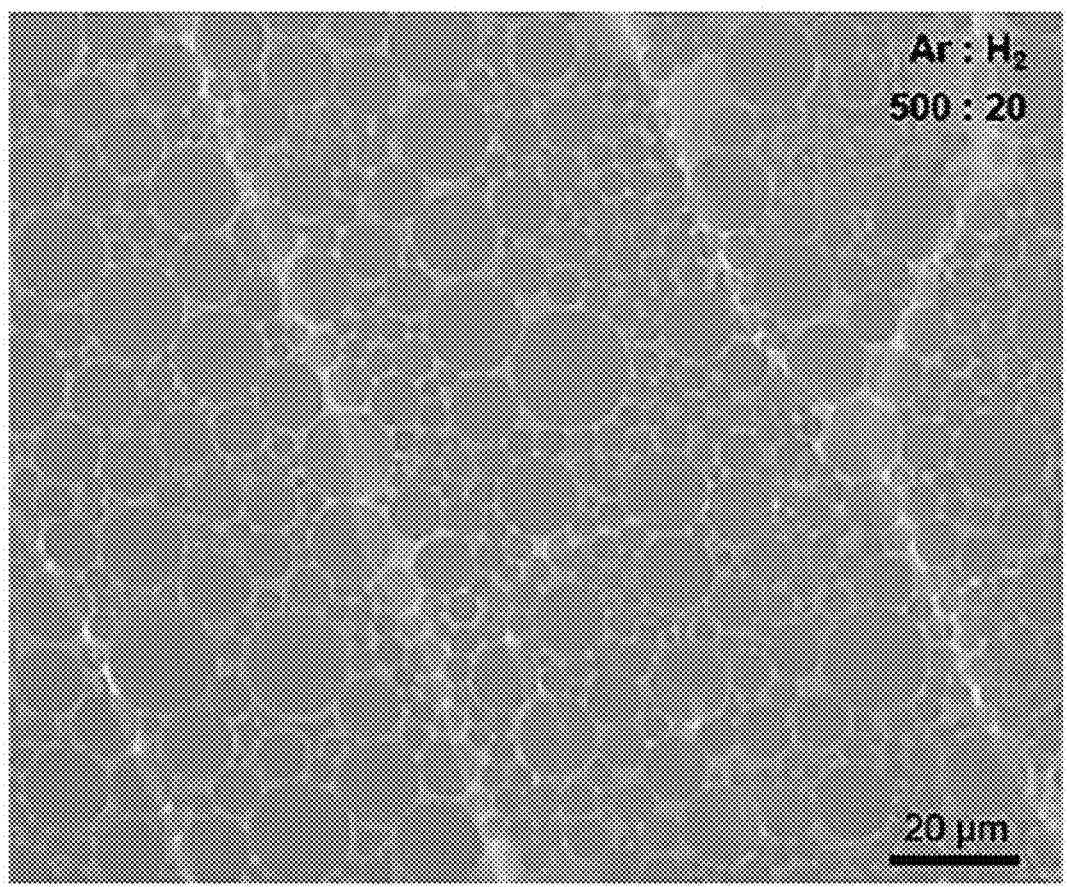
Figure 21C:
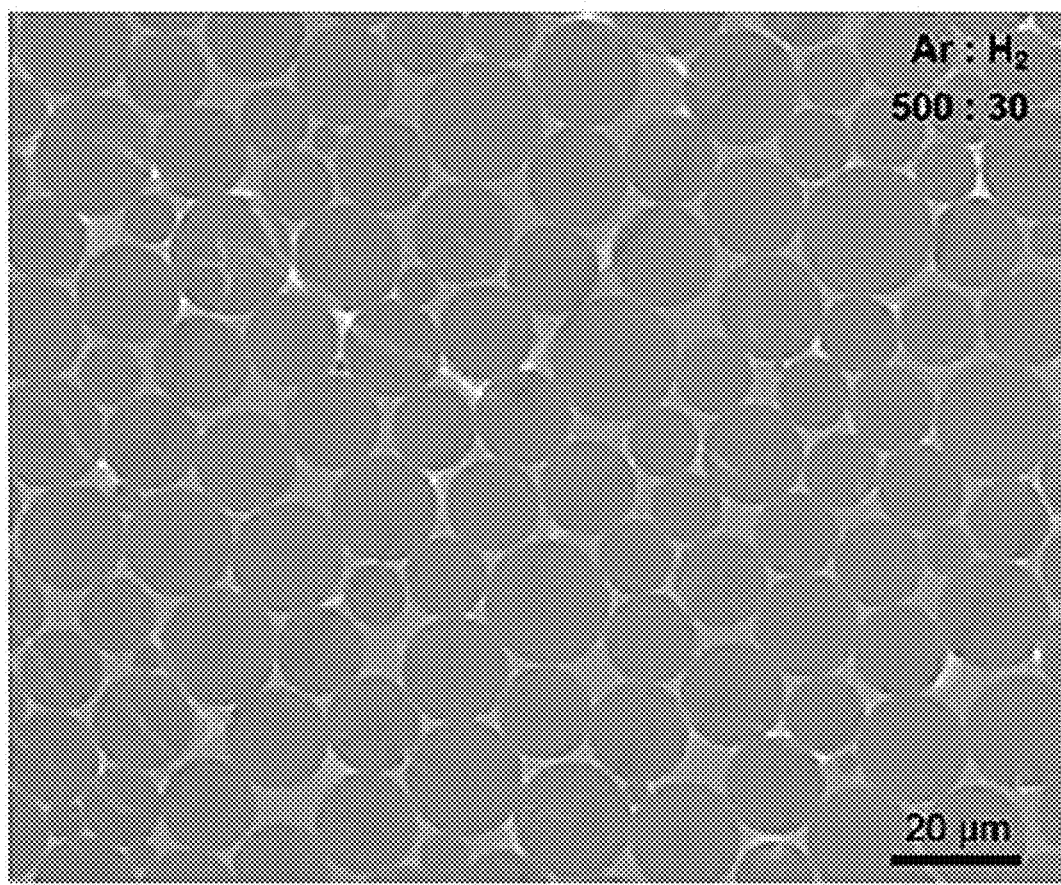
Figure 21D:
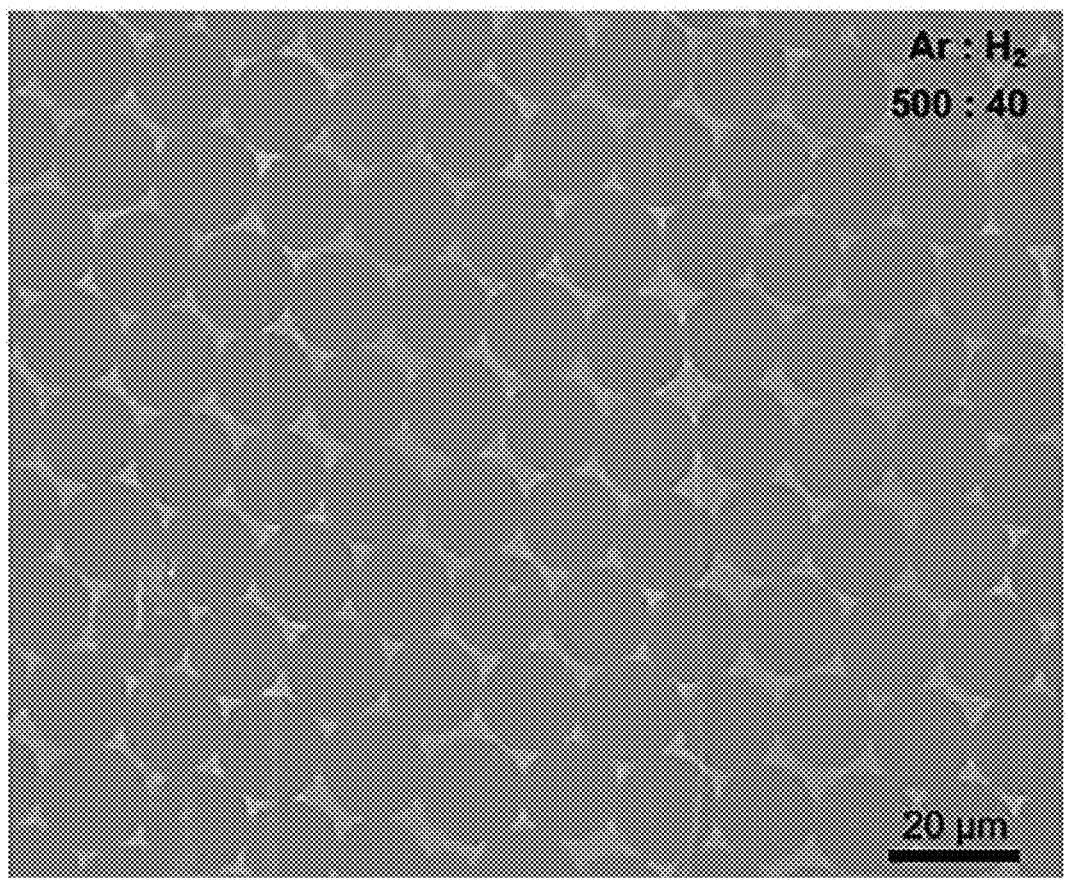
Figure 21E:
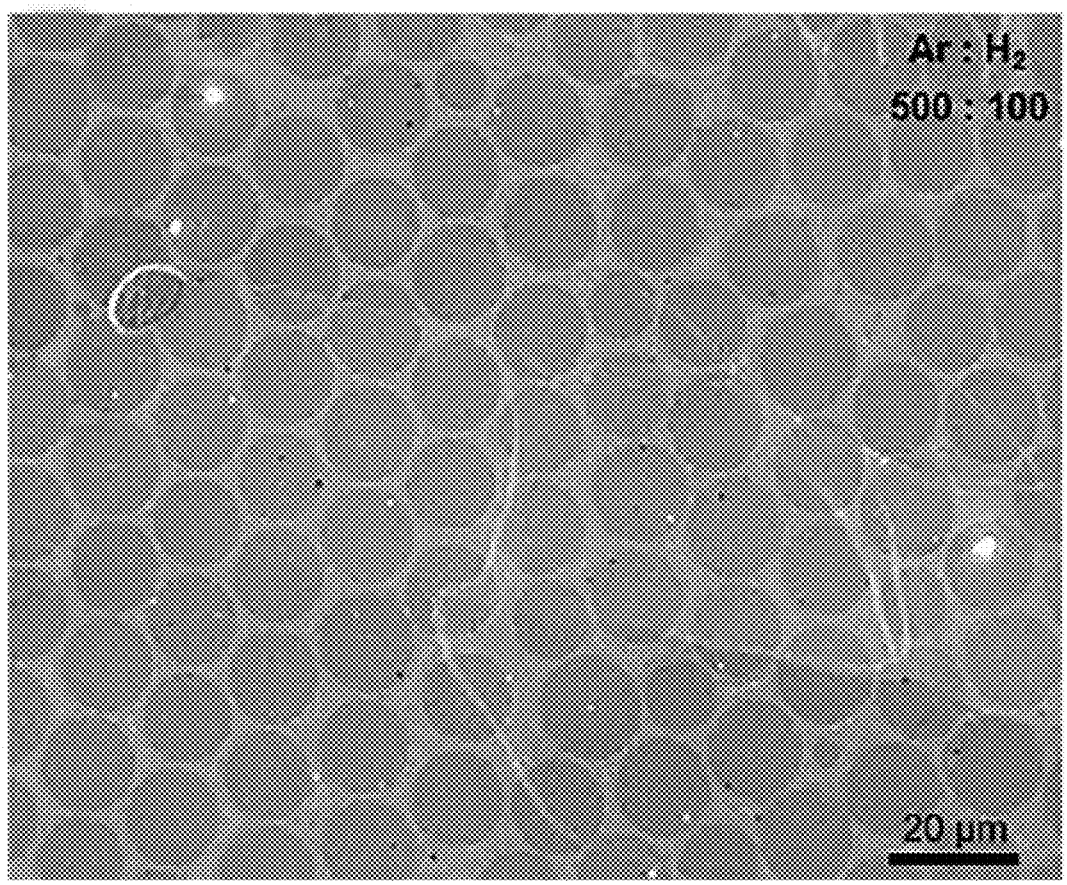
Figure 21F:
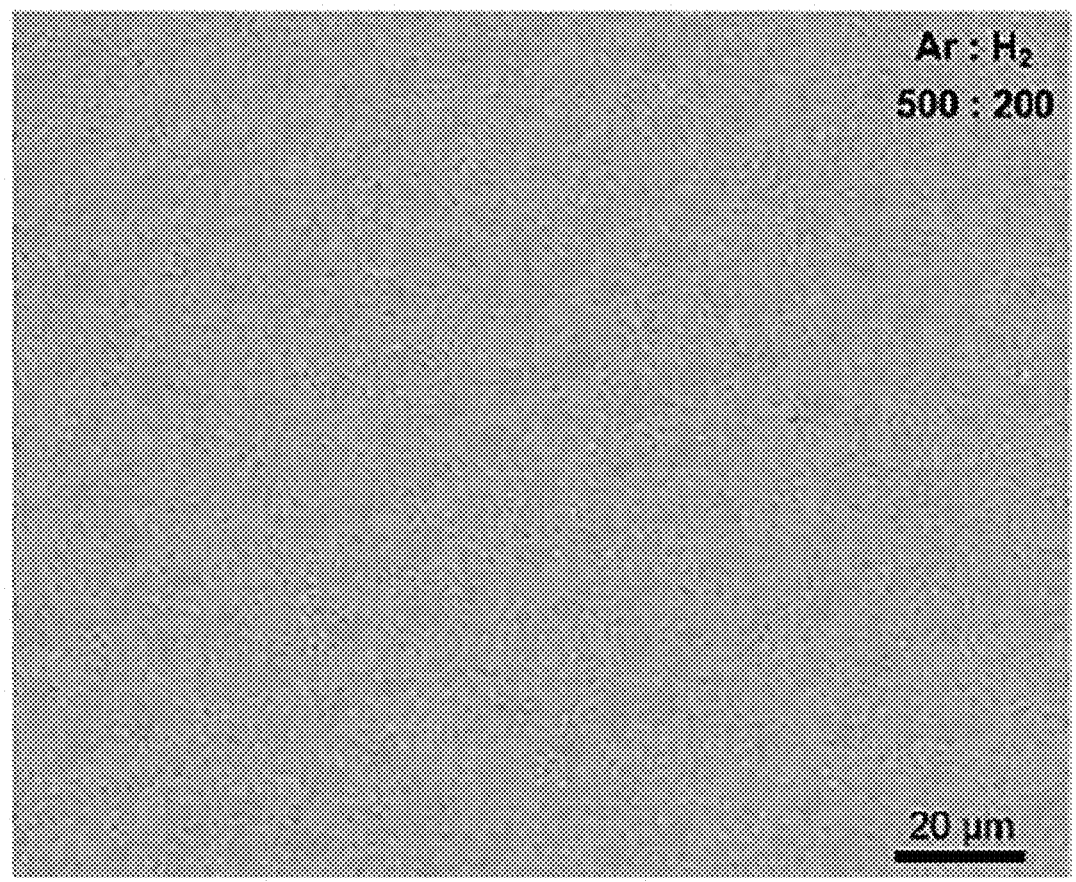

In an embodiment, in the step of self-aligning the h-BN crystal grains, each h-BN crystal grain can rotate at an angle of 60° or less due to the interaction between adjacent h-BN crystal grains. Such a rotation is specifically illustrated in FIG. 19 at the melting temperature of the second substrate, because the cohesive energy of the B—N bond is significantly larger than those of the B—B bond and the N—N bond, for example at a temperature of a range of 1,000 to 1,800° C. At the growth temperature (about 1,100° C.), the B—B and N—N bonds may not be maintained and only the B—N bond may be maintained due to high energy.

Next, adjacent h-BN crystal grains may be merged to form the h-BN template. In particular, the single crystalline h-BN thin film with excellent quality may be prepared through a first step growth in which the h-BN nuclei formed on the second substrate are grown to the h-BN crystal grains and a second step growth in which the h-BN template is formed by merging adjacent h-BN crystal grains.

In an embodiment, the supply amount of the nitrogen source and the boron source may be increased in the step of merging adjacent h-BN crystal grains to form the h-BN template.

Figure 26:
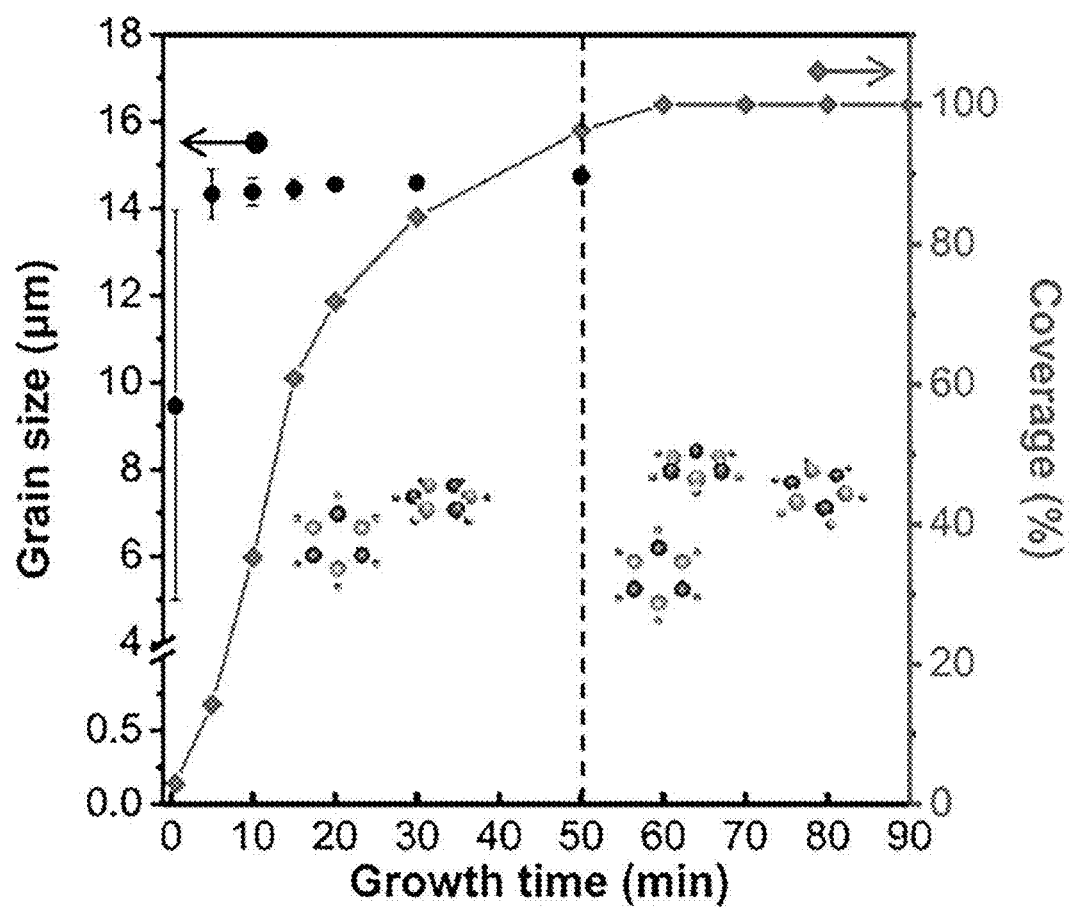
FIG. 26 illustrates a crystal grain size and a coverage of monolayer h-BN thin films with an increase in growth time.
Figure 27A:
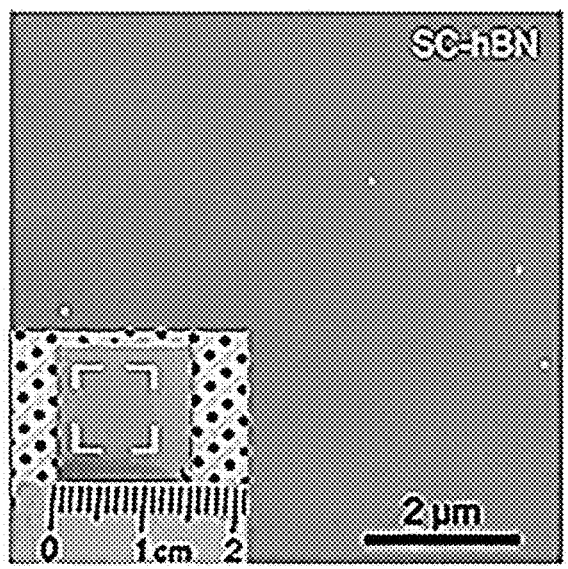
FIGS. 27A to 27F illustrate before and after an oxidation test by transferring SC-hBN and PC-hBN to a copper foil.
Figure 27B:
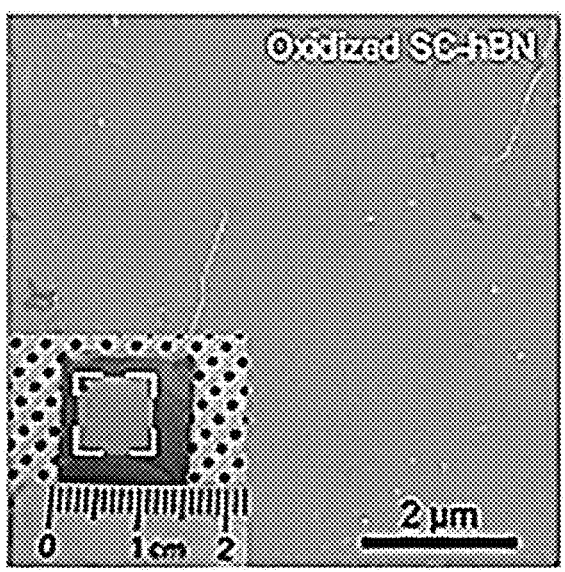
Figure 27C:
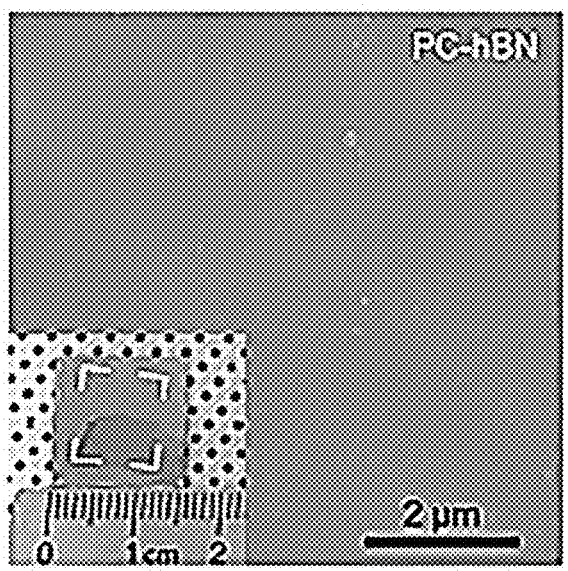
Figure 27D:
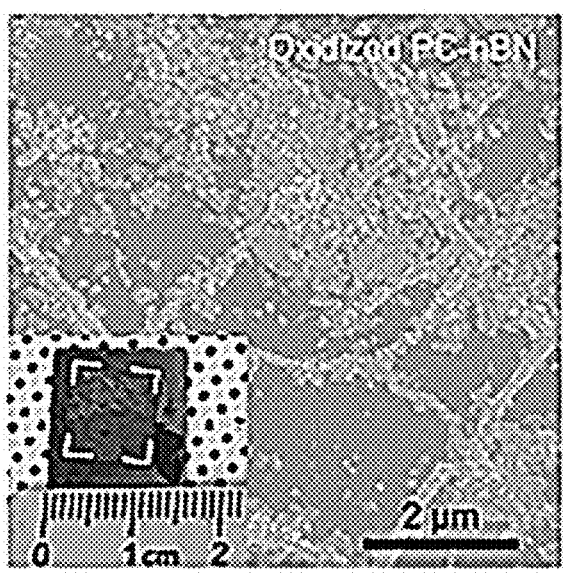
Figure 27E:
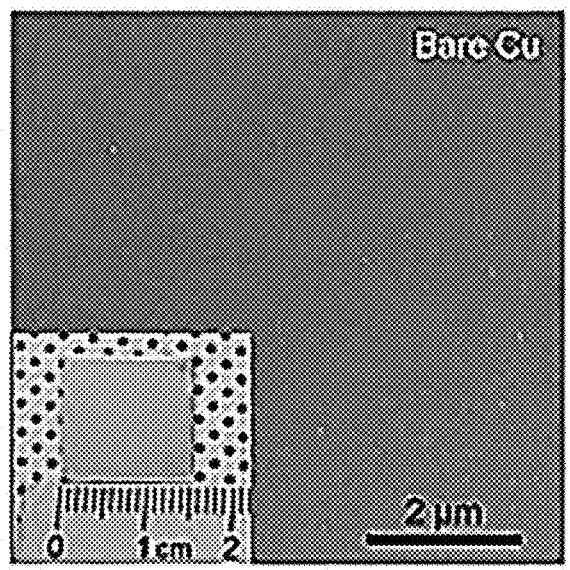
Figure 27F:
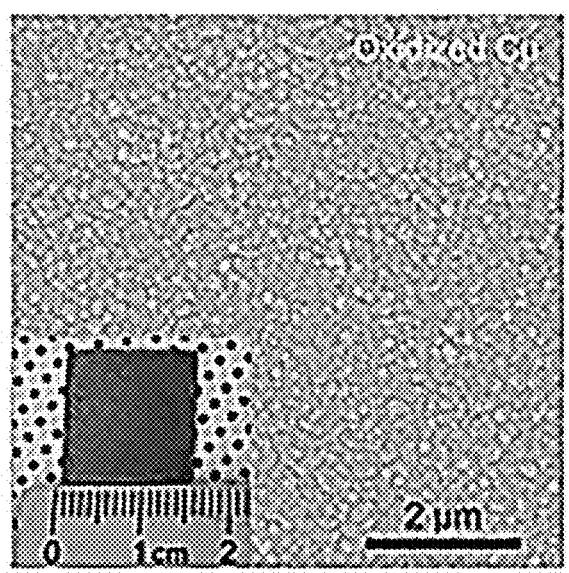

In an embodiment, the h-BN crystal grains may be further grown for 10 to 60 minutes to merge with adjacent crystal grains. When the growth is performed less than 10 minutes, the crystal grains may not be sufficiently merged, and when the growth is performed 60 minutes or more, additional merging may be insufficient. FIG. 20 illustrates a single-layer h-BN thin film according to the second stage growth time, and since surface-mediated growth is dominant, it can be confirmed that it is grown to the single-layer h-BN thin film even if the growth time is increased. In addition, in FIG. 26, it can be confirmed that about 100% coverage is achieved at the growth time of 60 minutes or more.

In an embodiment, by the nitrogen source and the boron source, no crystal grains are formed in the liquid state and the single-layer h-BN crystal grains are formed on the surface of the flat second substrate, and rearrangement of the h-BN crystal grains is performed while moving freely on the surface of the liquid second substrate. Thereafter, the h-BN, which is formed according to the large crystal grains generated by the hardening of the surface of the second substrate in the gradually cooling step, is arranged. The crystal grain size is several millimeters in diameter and the surface is very smooth, so that it becomes optimum h-BN growth conditions and h-BN can grow in a single layer under these growth conditions.

In an embodiment, the cooling step may be carried out at a cooling rate of −100.0 to −0.1° C./min, for example, may be performed at a cooling rate of −10.0 to −0.1° C./min, −5.0 to −0.1° C./min, or −2.0 to −0.1° C./min. Intact SC-hBN growth can be difficult when the growth is performed at a cooling rate above −0.1° C./min, and tearing or folding of h-BN may occur due to rapid cooling when the growth is performed at cooling rates below −100.0° C./minute.

On the other hand, since the surface of the second substrate is very smooth in the step of gradually cooling following the molten state, it is not only possible to omit a polishing process of the surface as in the prior art but also to produce the h-BN single-layer thin film having high quality.

In an embodiment, the step of forming the single crystalline h-BN template may further comprise a step of forming a third substrate in which the third substrate is formed on the h-BN template. Specifically, the step of forming the third substrate, in which the third substrate is formed on the h-BN template, may be further included after the step of forming the h-BN template.

In an embodiment, after the step of forming the h-BN thin film, the step of forming the third substrate, in which the third substrate is formed on the h-BN thin film, may be a step of forming the third substrate on the formed h-BN template. Here, the third substrate to be formed may be at least one selected from a group consisting of a polymer, an adhesive tape, a heat peeling tape, and a photoresist. The polymer may be selected from a group consisting of polyethylene terephthalate (PET), polyethylene sulfone (PES), polyethylene naphthalate (PEN), polycarbonate (PC), polymethyl methacrylate (PMMA), polyimide (PI), ethylene vinyl acetate (EVA), polypropylene terephthalate (PPT), polyethylene terephthalate glycerol (PETG), polycyclo hexylenedimethylene terephthalate (PCTG), modified triacetylcellulose (TAC), cycloolefin polymer (COP), cycloolefin copolymer (COC), dicyclopentadiene polymer (DCPD), cyclopentadiene polymer (CPD), polyarylate (PAR), polyetherimide (PEI), polydimethylsiloncene (PDMS), silicone resin, fluorine resin, and modified epoxy resin.

In addition, as a method for forming the polymer as the third substrate, a known polymer coating method such as spraying, dip coating, and spin coating may be used by mixing the polymer with a solvent. If necessary, a monomer and a crosslinking agent may be mixed and coated on the h-BN template to form the polymer on the h-BN template through polymerization and crosslinking. In addition, in the case of the adhesive tape and the heat peeling tape, the third substrate can be formed by pressing the tapes.

In an embodiment, the third substrate supports h-BN until a step of efficiently separating the prepared h-BN template from the stacked body of the first substrate and the second substrate, or a step of transferring in which h-BN is transferred to a fourth substrate. After the h-BN template is separated from the first and second substrates, the third substrate may be removed by using a solvent or heat to separate the h-BN template separately, may be removed at the same time as the step of transferring h-BN in which h-BN is transferred to the fourth substrate, or may be removed after the step of transferring h-BN.

In an embodiment, the third substrate may be at least one selected from a group consisting of a polymer, an adhesive tape, a heat peeling tape, and a photoresist.

In an embodiment, after the step of forming the third substrate, a step of separating the h-BN template from the second substrate in an aqueous solution may be further included.

In an embodiment, after the step of forming the third substrate, the step of separating the h-BN template, in which the h-BN template is separated from the second substrate in the aqueous solution, may be a step of separating an interface with the h-BN template with hydrogen generated on the surface of the second substrate by applying a negative voltage to the stacked body on which the third substrate is formed in an alkaline solution atmosphere and applying a positive voltage to a separate counter metal in the alkaline solution.

For example, the h-BN template is separated by the hydrogen gas generated in the interface between the second substrate and the h-BN template and is not separated by an external physical force or other means. Therefore, the stacked body of the first substrate and the second substrate can be separated efficiently without giving damage to the surface. In addition, the laminated body sheet of the first substrate and the second substrate remaining after the h-BN template is separated may be washed and repeatedly used to prepare the h-BN template.

In an embodiment, the polymer as the third substrate is coated on the h-BN template, a negative voltage is applied in the alkaline solution atmosphere, a positive voltage is applied to the counter metal, and thereby the h-BN can be separated by hydrogen generated in the metal. Here, a remaining gold-tungsten stacked body sheet after separation of h-BN can be washed and used repeatedly.

In an embodiment, the separation process (bubbling transfer process) of the grown h-BN template may be as follows: placing the h-BN/gold/tungsten substrate on a clean PET film, and adhering a vicinity of an edge of only a top of the h-BN with Scotch tape to coat with the polymer which is the third substrate. The polymer, which is the third substrate used in the separation process of the thin film, was used by mixing 950 PMMA A9 and anisole in volume ratio of 1:1. 950 PMMA A9 is a product in which PMMA is dissolved in anisole as much as 9 to 11 wt. %. A concentration of a polymer coating solution prepared as described above is 4 to 6 wt. %. The polymer coating solution was dropped on the h-BN template and spin-coated by using a spin coater at a speed of 2,500 rpm for 1 minute. After the spin coating, the solvent is evaporated in an oven at 80° C. for about 1 hour, and then the tape portion was removed. The aqueous solution used for the separation of the h-BN template was used to separate the h-BN template with hydrogen generated on the surface of gold (Au) substrate by applying a negative voltage to the h-BN/gold/tungsten substrate and by applying a positive voltage to the counter metal (platinum) under conditions of voltage and current of 10 V and 1.8 A using sodium hydroxide solution of 500 mL at a concentration of 0.25 M.

In an embodiment, after the step of separating the h-BN template, a step of transferring the h-BN template to the fourth substrate may be further included.

In an embodiment, after the step of separating the h-BN template, the step of transferring h-BN to the fourth substrate may be a step of transferring h-BN by causing the fourth substrate to be transferred to come into contact with the surface of the separated h-BN template. The fourth substrate is any one of a carbon grid, a flexible substrate, a conductor, a dielectric, or a semiconducting material. More preferably, the flexible substrate is any one of polyethylene terephthalate (PET), polyethylene sulfone (PES), polyethylene naphthalate (PEN), poly carbonate (PC), polymethyl methacrylate (PMMA), and polyimide (PI). The conductive material is graphene, the dielectric material is any one of $MoS_2$ and BCN, and the semiconducting material is silicon or silicon wafer. In addition, the method for transferring may be performed by a dry process, a wet process, or a roll-to-roll process, but is not limited thereto.

In an embodiment, the fourth substrate may be any one selected from a group consisting of a flexible substrate, a conductor, a dielectric, and a semiconducting material.

In an embodiment, the stacked body of the separated PMMA/h-BN thin film is floating on the surface of the aqueous sodium hydroxide solution, so that stacked body of the PMMA/h-BN template is lifted up from the solution using a clean PET or glass substrate and transferred to distilled water, and repeatedly washed about 3 times. Therefore, the aqueous sodium hydroxide solution may be removed. The washing process in distilled water can be performed for 20 minutes, and after washing, the pH of the distilled water was checked by using litmus paper to confirm the absence of a base. The washed stacked body of the PMMA/h-BN template is transferred to the substrate of the fourth substrate desired in a cleaned state, and the fourth substrate to be transferred stands up in an oven at 80° C. in a state of attaching PMMA/h-BN to the substrate using plate-like $SiO_2$/Si, Si, Quartz, PET, a glass substrate, or the like, and is evaporated. Therefore, h-BN can be better adhered to the substrate of the fourth substrate. PMMA that is the third substrate is first removed by using acetone and then heated by using an additional heat treatment device about 5 hours, in conditions of a temperature of 450° C., argon of 700 sccm, hydrogen of 300 sccm, and at atmospheric pressure, to completely remove remaining PMMA in the h-BN template.

In an embodiment, after the step of transferring the h-BN template, a step of removing the third substrate may be further included.

In an embodiment, after the step of transferring the h-BN template, the step of removing the third substrate may be a step of removing the third substrate using a solvent or heat. If the third substrate is a material that is soluble in a solvent, such as a polymer or a photoresist, the third substrate may be removed by using the solvent. In the case of the adhesive tape, the third substrate may be removed by using a physical method, and in the case of the heat peeling tape, the third substrate may be removed by heating.

In an embodiment, the h-BN template is a single crystal and may be a few millimeters in size, and preferably, may be a single crystal of a few millimeters in size.

Step of Forming Plurality of Nuclei

In an embodiment, the method for 2D epitaxial growth may comprise a step of forming a plurality of nuclei by depositing heterogeneous precursors on the h-BN template.

Here, a material excellent in thermal and chemical stability in the h-BN template 2D materials has a hexagonal structure in which boron and nitrogen atoms of the h-BN layer are alternately composed.

In an embodiment, the h-BM template may act as a catalyst for van der Waals epitaxial growth due to an h-BN-specific ionic bonding structure of boron and nitrogen.

In an embodiment, the plurality of deposited nuclei can be oriented in one direction.

Specifically, when the plurality of deposited nuclei are oriented in one direction, the plurality of deposited nuclei may be affected by the quality of the single crystalline h-BN template, such as whether or not impurities are contained. Accordingly, the heterogeneous structure layer to be formed may have a single crystalline structure.

In an embodiment, the 2D heterogeneous material grown in the h-BN template is disposed by the crystal plane of h-BN, and the single crystalline 2D heterogeneous material may be grown in the single crystalline h-BN template.

In an embodiment, the h-BN template grown at high temperature may be etched due to active gas. The method for directly growing the 2D heterogeneous material in the h-BN template is performed to stop supply of unsaturated boron nitride after growth of the unsaturated h-BN template is completed, and supply the hetero-precursor under reaction conditions such as the same temperature and pressure in a short time to prevent etching of the h-BN template.

In an embodiment, the heterogeneous precursor may comprise one or more of methane ($CH_4$), ethane ($C_2H_6$), and ethyne ($C_2H_2$), or metal oxide ($MO_3$) and chalcogen (X), in which the M may be Ti, V, Zr, Nb, Mo, Tc, Pd, Hf, Ta, W, Re, or Pt, and the X may be S, Se, or Te.

In an embodiment, the deposition may be any one deposition method selected from a group consisting of organometallic chemical vapor deposition (MOCVD), plasma chemical vapor deposition (PECVD), and atomic layer deposition (ALD).

Step of Forming Heterostructure Layer

In an embodiment, the method for 2D epitaxial growth may comprise a step of forming the heterogeneous structure layer by growing the plurality of deposited nuclei with van der Waals epitaxial growth.

In an embodiment, the method for 2D epitaxial growth may be performed to directly grow the heterogeneous structure layer directly on the h-BN template continuously immediately after the formation of the single crystalline h-BN template. Specifically, the h-BN template grown at high temperature may be etched due to the active gas, and the method for direct growth may be performed to stop the supply of the unsaturated boron nitride after the growth of the unsaturated h-BN template is completed and supply continuously the heterogeneous precursor under reaction conditions such as the same temperature and pressure in a short time to prevent etching of the h-BN template. Through this, it can be free from influence of unnecessary impurities and oxidation from the outside.

In an embodiment, the heterogeneous structure layer may be the single crystal. Here, electrical characteristics of the heterogeneous structure layer of the single crystal may be significantly increased compared to those of the polycrystalline layer.

In an embodiment, a material of the heterogeneous structure layer may be included without limitation, as long as it corresponds to a heterogeneous single crystalline 2D material. For example, the heterogeneous structure layer may comprise any one of graphene or a transition metal chalcogenide compound ($MX_2$), in which the M may comprise titanium (Ti), vanadium (V), zirconium (Zr), niobium (Nb), molybdenum (Mo), technetium (Tc), palladium (Pd), hafnium (Hf), tantalum (Ta), tungsten (W), rhenium (Re), or platinum (Pt), and the X may comprise sulfur (S), selenium (Se), or telenium (Te).

In an embodiment, the step of forming the heterogeneous structure layer may comprise heat treatment at a temperature of 600° C. to 1,200° C.

Figure 3:
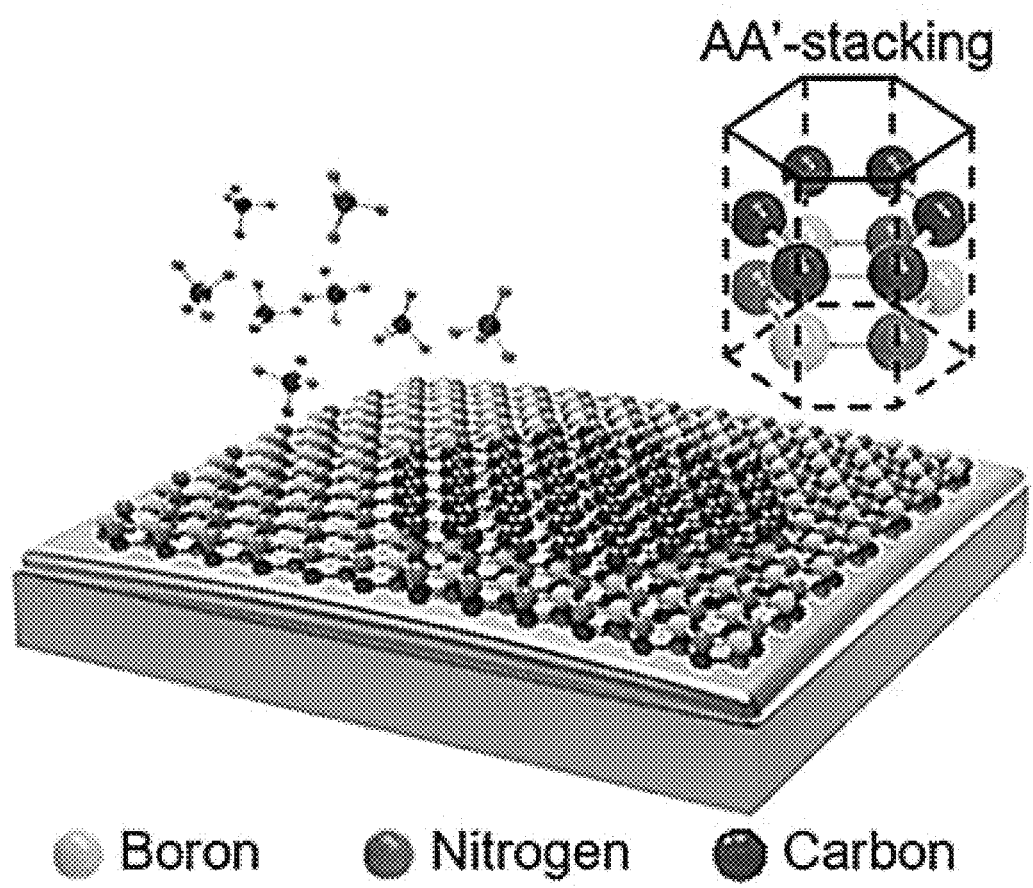
FIG. 3 illustrates a stacked structure according to an embodiment of the present invention, in which a graphene heterogeneous structure layer is stacked on the h-BN template in an AA'-stacking pattern.

In an embodiment, the heterogeneous structure layer formed on the h-BN template can be stacked with the van der Waals force. For example, the graphene layer formed on the h-BN template may be stacked in a AA'-stacking pattern. The AA'-stacking is illustrated in FIG. 3.

Stacked Structure

In another embodiment of the present invention, there is provided a stacked structure comprising the single crystalline h-BN template and the heterogeneous structure layer, and in which the single crystalline h-BN template and the heterogeneous structure layer are stacked with the van der Waals force, and the heterogeneous structure layer is the single crystal.

In an embodiment, the heterogeneous structure layer may comprise one of graphene and a transition metal chalcogenide compound ($MX_2$), in which the M may comprise molybdenum (Mo) or tungsten (W), and the X is sulfur (S), selenium (Se), or telenium (Te).

In an embodiment, the single crystalline h-BN template may serve as an insulating layer and, for example, may be used as the insulating layer when a material-based flexible semiconductor device is manufactured. Therefore, if the single crystalline h-BN is applied as a template, unnecessary transfer processes can be greatly reduced, and the 2D material where the h-BN template is grown on the surface is induced to the epitaxial growth. Therefore, there is an advantage that the electrical properties can be significantly improved.

In an embodiment, the stacked structure may be applied to a transistor, a gas/moisture blocking film, an antioxidant film, or a semiconductor device. In particular, in the application described above, since the single crystalline h-BN template can act as an insulating layer, unnecessary processes for transferring the formed heterogeneous structure layer to a separate substrate can be greatly reduced, and the 2D material in which the h-BN template is grown on the surface is induced to the epitaxial growth. Therefore, there is an advantage that the electrical properties can be significantly improved.

Gas/Moisture Blocking Film

Figure 29A:
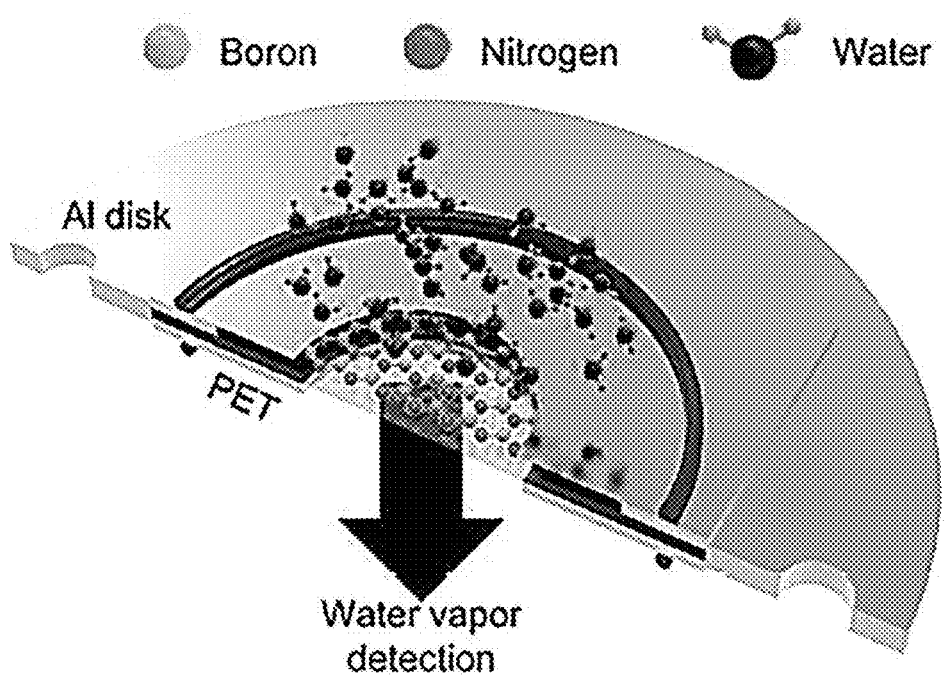
FIGS. 29A and 29B respectively illustrate a schematic view and a photograph of a sample for moisture permeability measurement according to an embodiment of the invention.
Figure 29B:
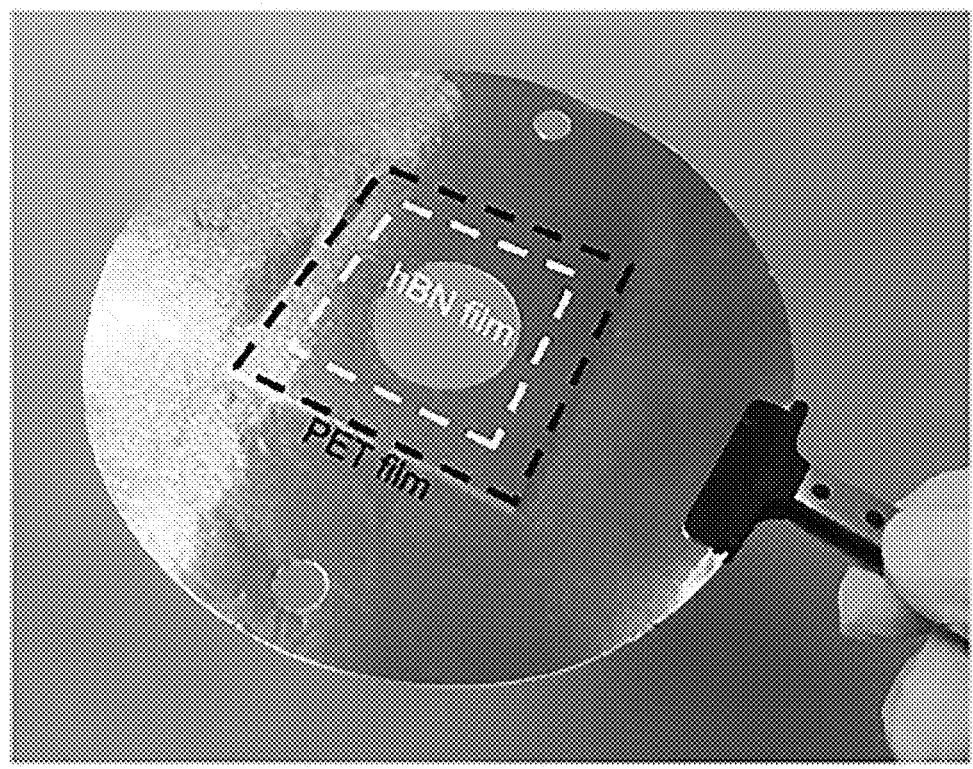

In an embodiment of the present invention, there is provided a gas/moisture blocking film including the stacked structure according to an embodiment of the present invention. In addition, there is provided a gas/moisture blocking film including the single crystalline h-BN template; and the fourth substrate according to an embodiment of the present invention. The gas/moisture blocking film may have excellent gas and moisture barrier properties by synthesizing the single crystalline 2D material of defect-free with the stacked structure. FIGS. 29a and 29b respectively illustrate a schematic view and a photograph of the gas/moisture blocking film in accordance with an embodiment of the present invention.

In an embodiment, the gas/moisture blocking film may further comprise a heterogeneous structure layer.

In an embodiment, the fourth substrate may be the same substrate as that in the method for 2D epitaxial growth described above, for example, the fourth substrate may be any one of a carbon grid, a flexible substrate, a conductor, a dielectric, or a semiconducting material. More preferably, the flexible substrate may be any one of polyethylene terephthalate (PET), polyethylene sulfone (PES), polyethylene naphthalate (PEN), polycarbonate (PC), polymethyl methacrylate (PMMA), and polyimide (PI). The conductive material may be graphene, the dielectric material may be one of $MoS_2$ and BCN, and the semiconductor material may be silicon or a silicon wafer.

In an embodiment, the gas/moisture blocking film may have a thickness of 0.34 to 50 nm.

FIG. 27 illustrates SEM images before (left) and after (right) of an oxidation test by transferring SC-hBN and PC-hBN to a copper foil. In FIG. 27, it can be confirmed that a color of the film became dark after the oxidation test. In addition, some areas of the Cu surface covered with PC-hBN can withstand oxidation due to the presence of hBN crystal grains, but 02 or $H_2O$ gas can easily penetrate through structural defects such as point defects of PC-hBN. Therefore, it can be confirmed that Cu is oxidized.

Figure 28A:
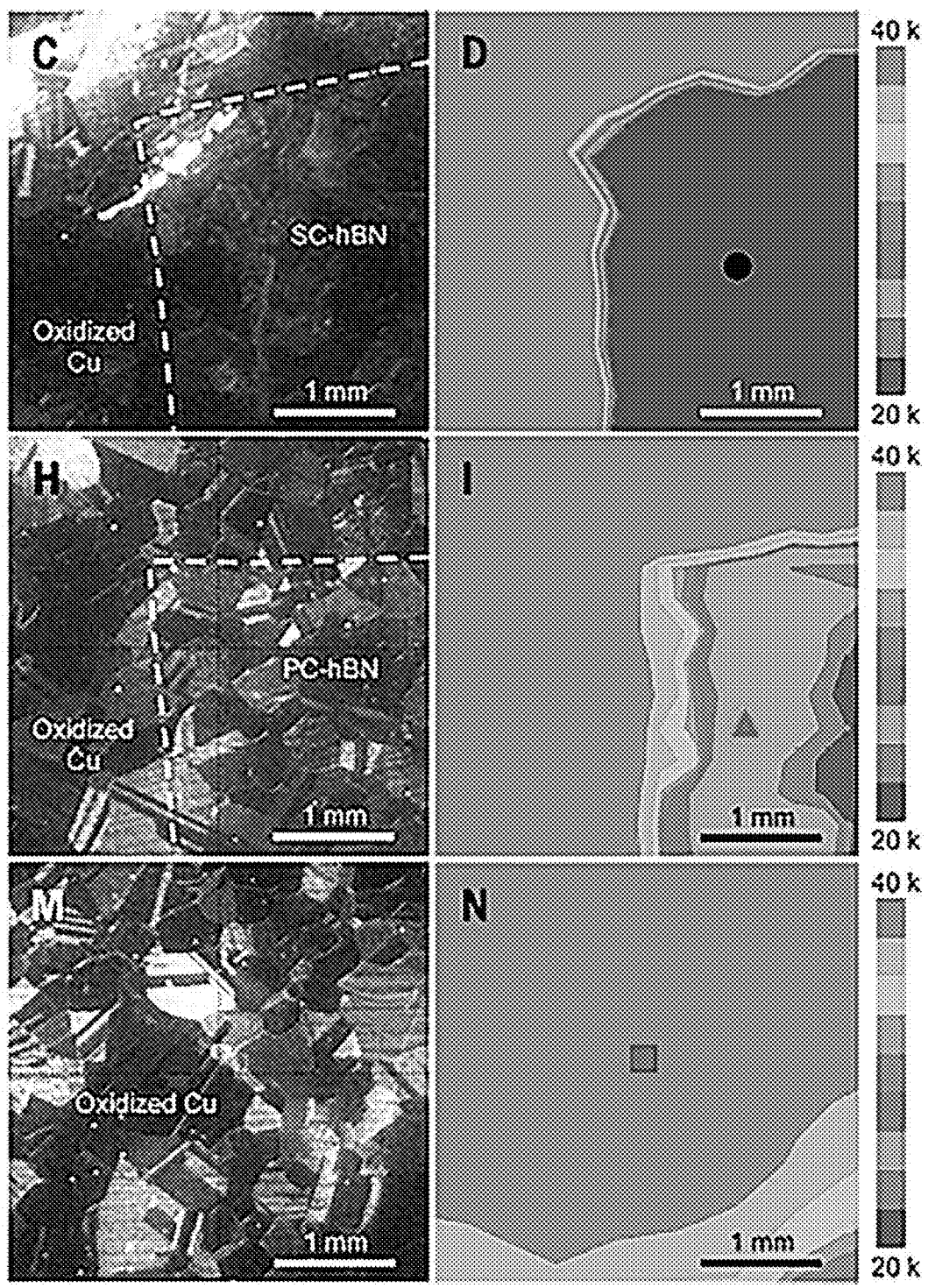
FIGS. 28A and 28B illustrate optical images and XPS mapping images of the same portions as a result of an oxidation test by transferring SC-hBN and PC-hBN to the copper foil.
Figure 28B:
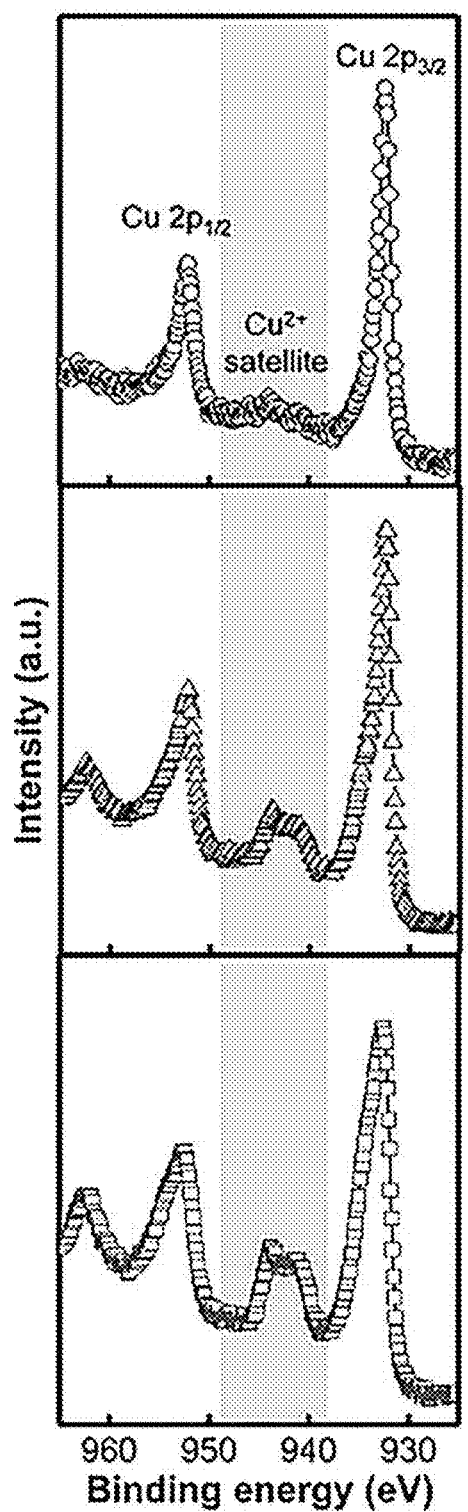

FIGS. 28a and 28b illustrate a result of quantitative analysis of the gas blocking film of SC-hBN through mapping of an XPS map. In FIG. 28a, in order to perform quantitive Cu oxidation, each sample was analyzed under an optical microscope, and a corresponding region was XPS-mapped to a $Cu^{2+}$ satellite peak near 943 eV in the Cu 2p core level spectrum (see FIG. 28b). As a result, it was confirmed that SC-hBN had uniformly low CuO peak intensity, whereas the CuO peak was remarkably recorded in the PC-hBN and Cu samples. Therefore, it was confirmed that the gas/moisture blocking film containing SC-hBN serves as an excellent gas blocking film.

EXAMPLES

Hereinafter, the present invention will be described with reference to examples. However, the examples according to the present invention may be modified in various other forms, and the scope of the present invention should not be construed as being limited to the following examples. The examples of the present invention are provided to more fully describe the present invention to those skilled in the art.

Example 1: Preparation of Single Crystalline h-BN Template 1-1. Gold (Au) Catalyst Formation on Tungsten Substrate Gold (Au), a catalyst used in the preparation of h-BN, is melted at a temperature higher than the melting temperature of 1,063° C., and is changed to a spherical shape that minimizes the surface tension. In order to maintain gold in a form of a sheet, gold (Au) substrate which is the second substrate is placed on a tungsten substrate which is the first substrate, and is heated at a temperature higher than the melting point (1,064.18° C.) of gold to form a gold-tungsten sheet.

The tungsten substrate, which is the first substrate, has a size that can fit into a quartz tube of CVD equipment, and has a size of 2 cm×3 cm in the present experiment. Since gold (Au) substrate, which is the second substrate, needs to form a sheet in an entire area of the tungsten substrate, a substrate having the same size as that of the tungsten substrate or having an area of about 90% of the tungsten substrate was used. First, in a surface treating process of the tungsten substrate which is the first substrate, organic impurities are removed by an organic solvent such as acetone, isopropanol, or ethanol, and the tungsten substrate is immersed in a nickel etchant (including nitric acid) solution to remove inorganic impurities in form of small particles, washed with distilled water, and then is subjected to heat treatment for 1 hour at a temperature of 1,000° C. using the CVD equipment under a low pressure condition. In addition, in the surface treating process of the gold (Au) substrate which is the second substrate, organic impurities are removed by an organic solvent such as acetone, isopropanol, or ethanol, and the gold (Au) substrate is immersed in a nickel etchant (containing nitric acid) solution to remove inorganic impurities of small particles, and then is washed with distilled water. Since the gold (Au) substrate is not oxidized even if heat is applied in air, impurities can be effectively removed, and the gold (Au) substrate is heat-treated in air at a temperature of 1,000° C. for 1 hour using the CVD equipment.

1-2. Preparation of h-BN Template

Hexagonal boron nitride template (h-BN template) was prepared by using chemical vapor deposition on the formed gold-tungsten sheet.

A growth condition of h-BN is that an inside of the CVD chamber is made be a vacuum state ($1 \times 10^{-4}$ Torr or less) by drying with a dry pump for about 1 hour before heating the gold (Au) substrate, which is the second substrate, placed on the tungsten substrate which is the first substrate, external air particles and moisture are removed, a pump valve is closed, the dry pump is turned off, and then the chamber is filled with argon gas to be a state of atmospheric pressure of 760 Torr. At atmospheric pressure, argon gas of 500 sccm and hydrogen gas of 40 sccm flow, and an exhaust valve is opened to flow argon and hydrogen gas. Thereafter, heating is applied at room temperature to 1,100° C. for 30 minutes. Once the temperature reaches 1,100° C., the chamber is maintained at a temperature of 1,100° C. for 30 minutes for thermal stabilization. Gold is in a liquid state on the tungsten substrate at a temperature of 1,100° C., and h-BN thin film is synthesized while maintaining borazine of 0.4 sccm, argon of 500 sccm, and hydrogen of 40 sccm on the liquid gold surface. The h-BN thin film is disposed in an island form within 45 minutes, but is not formed in a thin film, so that borazine flows at 0.6 sccm for 15 minutes to form the h-BN template. After the growth is completed, the supply of borazine is cut off, and the h-BN template is cooled from a temperature of 1,100° C. to room temperature.

Example 2: Stacked Structure with Graphene Layer Formation

After the single crystalline h-BN template of Example 1 was grown, graphene was grown in-situ using a method for direct growth. In order to remove a residual unsaturated boron nitride precursor, argon and hydrogen were supplied respectively at flow rates of 500 sccm and 40 sccm for 5 minutes, and methane (99.9999%) was supplied at a flow rate of 1 sccm for 10 minutes under the same argon and hydrogen atmosphere to promote the van der Waals epitaxial growth. After the graphene growth in the h-BN template, a furnace was set to cool to room temperature at a cooling rate of −1° C./min.

Example 3: Preparation of Stacked Structure with WS$_2$ Layer Formation

The single crystalline h-BN template of Example 1 was used as a growth substrate for the synthesis of a single crystalline single-layer WS$_2$ film. NA$_2$WO$_4$.2H$_2$O of 2 g dissolved in acetyl acetone of 100 ml was prepared as a W precursor. The prepared W precursor solution was dropped on the h-BN template substrate and was spin-coated at 2,500 rpm for 1 minute. The prepared substrate was placed in a furnace equipped with a bubbler system and then ((NH$_4$)2S) dissolved in the distilled water at a concentration of 20% was used as the S precursor material. An inside of a chamber of the furnace is purged by supplying argon and hydrogen respectively at flow rates of 350 sccm and 30 sccm, at room temperature and then the temperature rises to 900° C. (~59° C./min) at room temperature. The WS$_2$ thin film is grown by supplying the S precursor at a flow rate of 2 sccm for 15 minutes. Argon and hydrogen are kept at the same flow rates, and the furnace is cooled to room temperature when growth is completed.

Example 4: Preparation of Stacked Structure with Formation of MoS$_2$ Layer

The single crystalline h-BN template of Example 1 was used as a growth substrate for the synthesis of the single crystalline single-layer MoS$_2$ film. NA$_2$MoO$_4$.2H$_2$O of 2 g dissolved in acetyl acetone of 100 ml was prepared as the W precursor. The prepared Mo precursor solution was dropped on the h-BN template substrate and was spin-coated at 2500 rpm for 1 minute. The prepared substrate was placed in the furnace equipped with the bubbler system and then ((NH$_4$)$_2$S) dissolved in the distilled water at a concentration of 20% was used as the S precursor material. The inside of the chamber of the furnace is purged by supplying argon gas at a flow rate of 350 sccm at room temperature and then the temperature rises to 850° C. (~59° C./min) at room temperature. The MoS$_2$ thin film is grown by supplying the S precursor at a flow rate of 2 sccm for 10 minutes. The argon gas is kept at the same flow rate and the furnace is cooled to room temperature when growth is completed.

Figure 4:
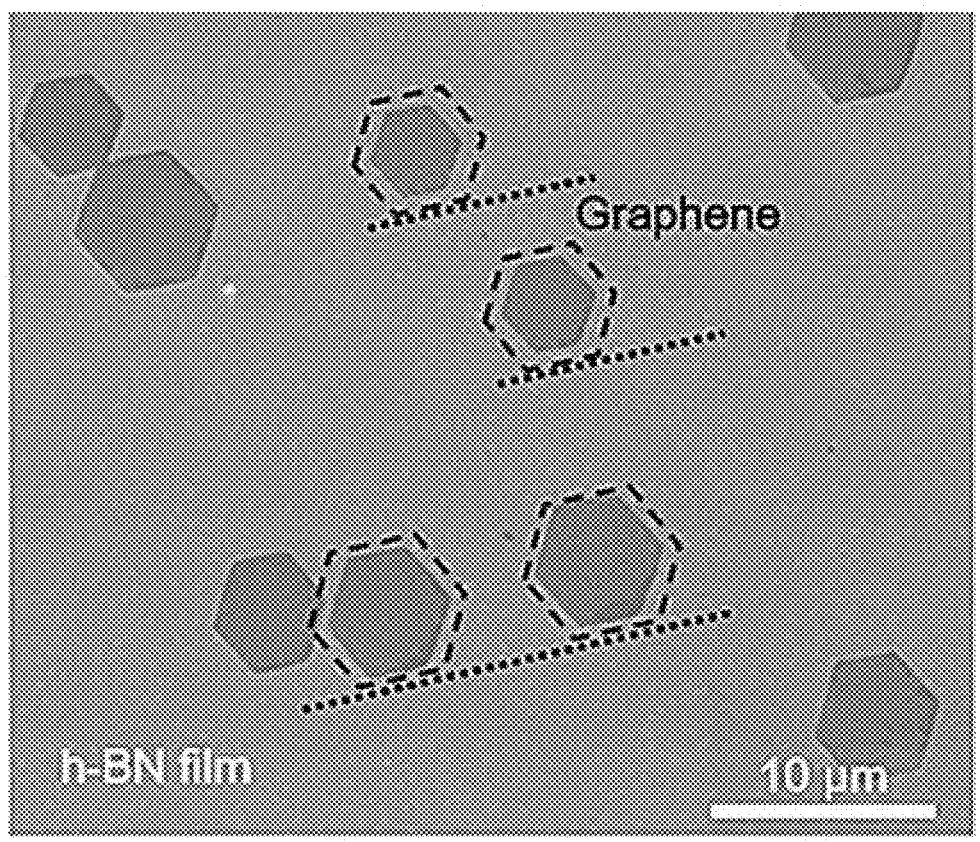
FIG. 4 illustrates a result that graphene nuclei, which are formed on the h-BN template in a method for growth according to an embodiment of the present invention, are arranged in a one direction, when observed by a field emission scanning electron microscope (FE-SEM)
Figure 5:
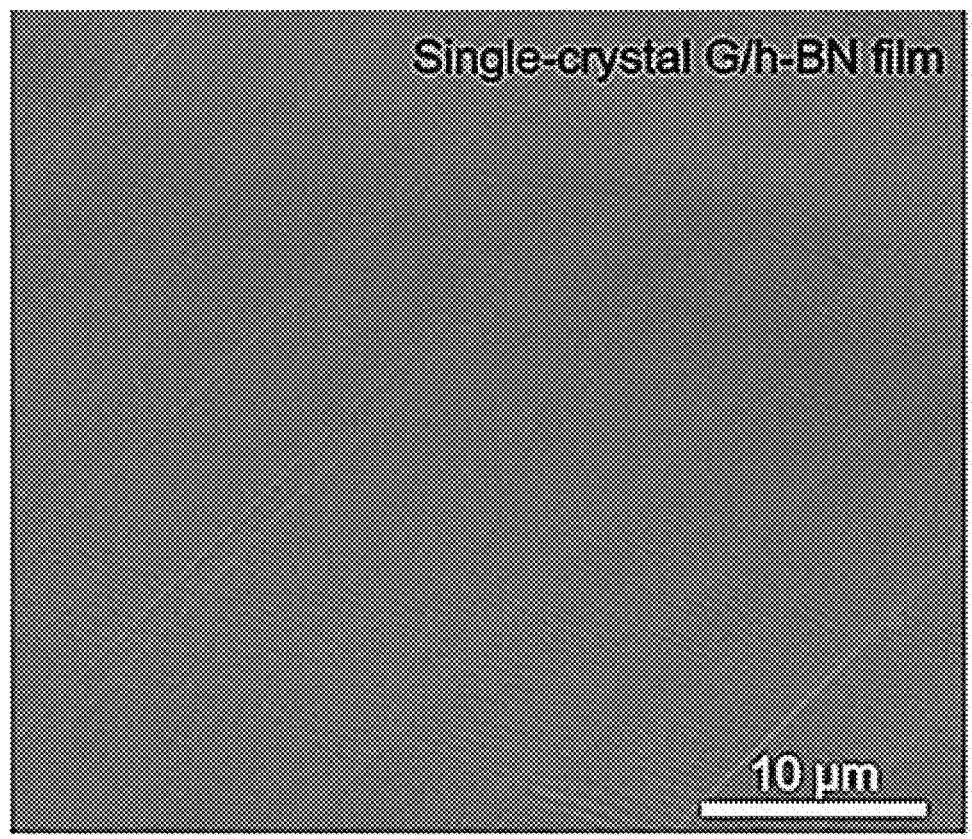
FIG. 5 illustrates a result of observing a surface of a graphene heterogeneous structure layer formed in a thin film form by increasing a growth time on the h-BN template in the method for growth according to an embodiment of the present invention, when observed by the field emission scanning electron microscope (FE-SEM)

Experimental Example 1: Structural Analysis Experiment 1-1. Field Emission Scanning Electron Microscope (FE-SEM) Analysis FIG. 4 illustrates that the graphene nuclei formed on the h-BN template prepared in Example 2 are observed by the field emission scanning electron microscopy (FE-SEM), and it can be confirmed that the graphene nuclei deposited on the h-BN template are well arranged in a one direction. FIG. 5 illustrates a result that the surface of the graphene heterogeneous structure layer formed in a thin film form is observed by the field emission scanning electron microscope (FE-SEM) on the h-BN template prepared in Example 2 with a long growth time, and it can be confirmed that the graphene heterogeneous structure layer has a single crystalline structure therethrough.

Figure 6:
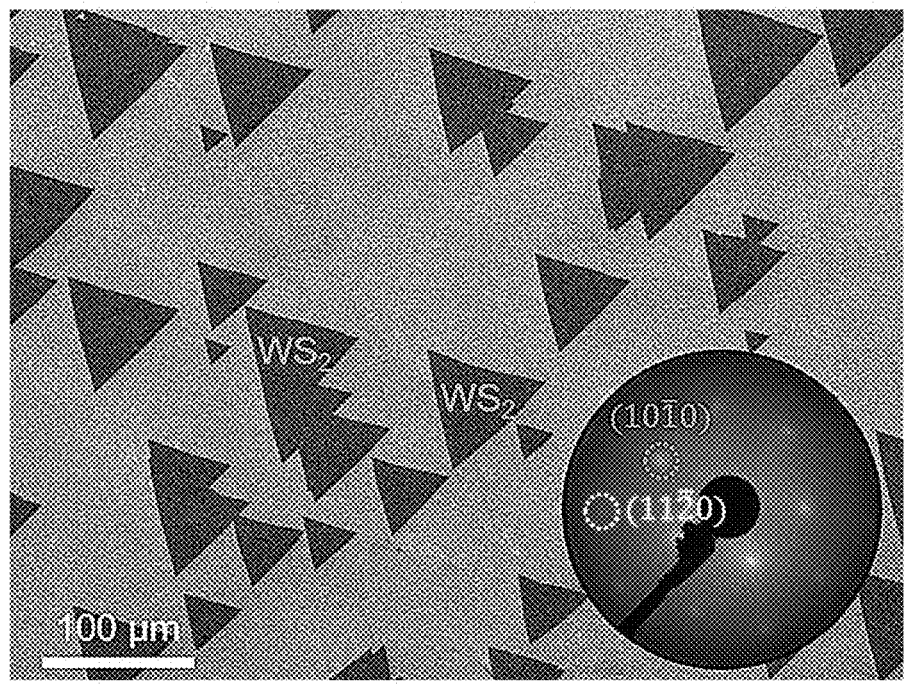
FIG. 6 illustrates $WS_2$ crystals and a single crystal in a large area arranged in a one direction as a result of observing the $WS_2$ nuclei formed on the h-BN template in the method for growth according to an embodiment of the present invention, by the field emission scanning electron microscopy (FE-SEM) and LEED.

In addition, FIG. 6 illustrates a result that the WS$_2$ nuclei formed on the h-BN template prepared in Example 3 are observed by the field emission scanning electron microscope (FE-SEM) and LEED, and it can be confirmed that the heterogeneous structure layer is the WS$_2$ crystal arranged in a one direction and is the large-area single crystal in FIG. 6.

Figure 7:
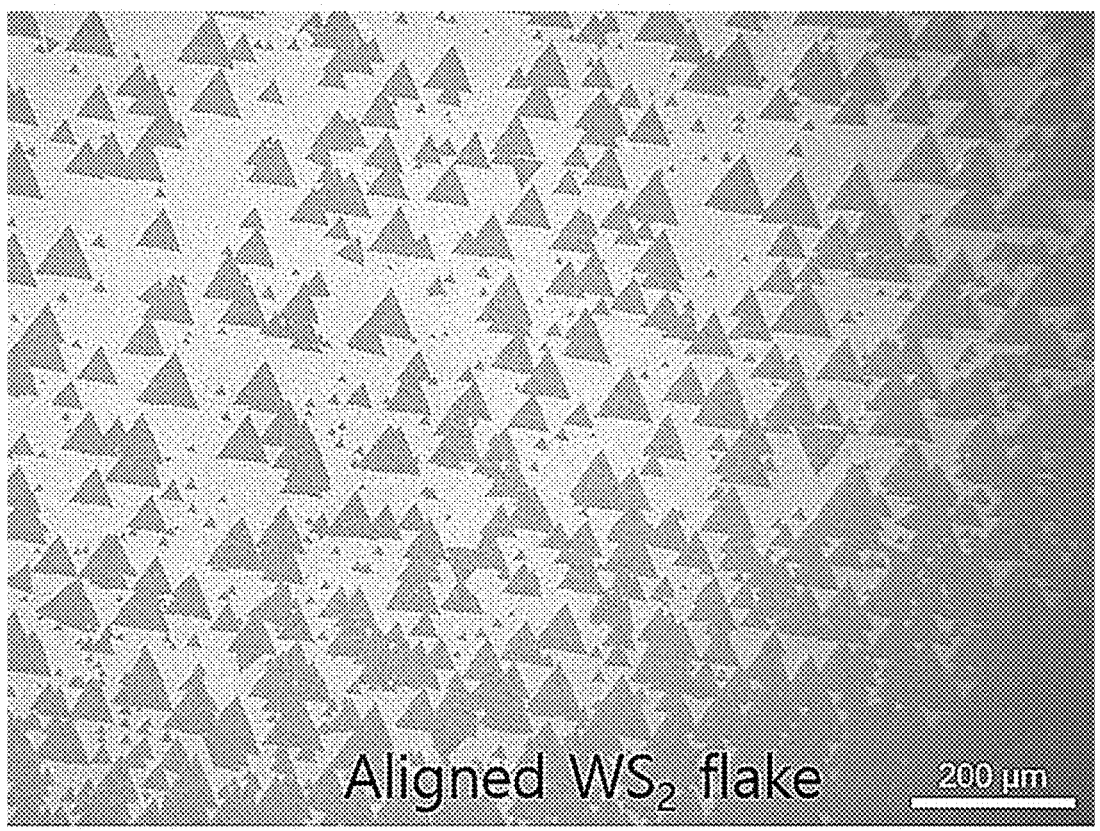
FIG. 7 illustrates $WS_2$ nuclei formed on the h-BN template in the method for growth according to an embodiment of the present invention, when observed by the field emission scanning electron microscope (FE-SEM) in low magnification.
Figure 8:
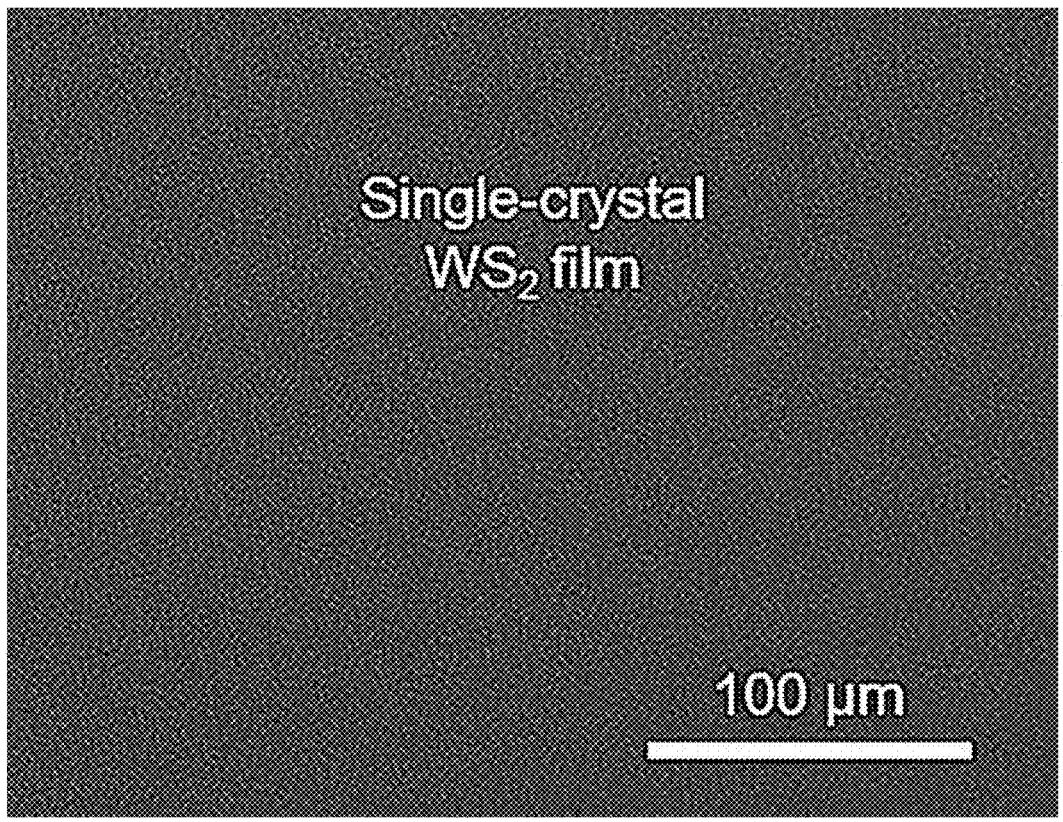
FIG. 8 illustrates a result of observing the surface of $WS_2$ of the thin film form formed on the h-BN template in the method for growth according to an embodiment of the present invention, by the field emission scanning electron microscope (FE-SEM)

FIG. 7 illustrates a result observing at a low magnification, and it can be confirmed that a plurality of nuclei formed on the h-BN template is uniformly arranged in one direction. FIG. 8 illustrates a result that the surface of the formed thin film-type WS$_2$ is observed by the field emission scanning electron microscope (FE-SEM), and it can be confirmed that the WS$_2$ layer has the single crystalline structure.

Figure 9:
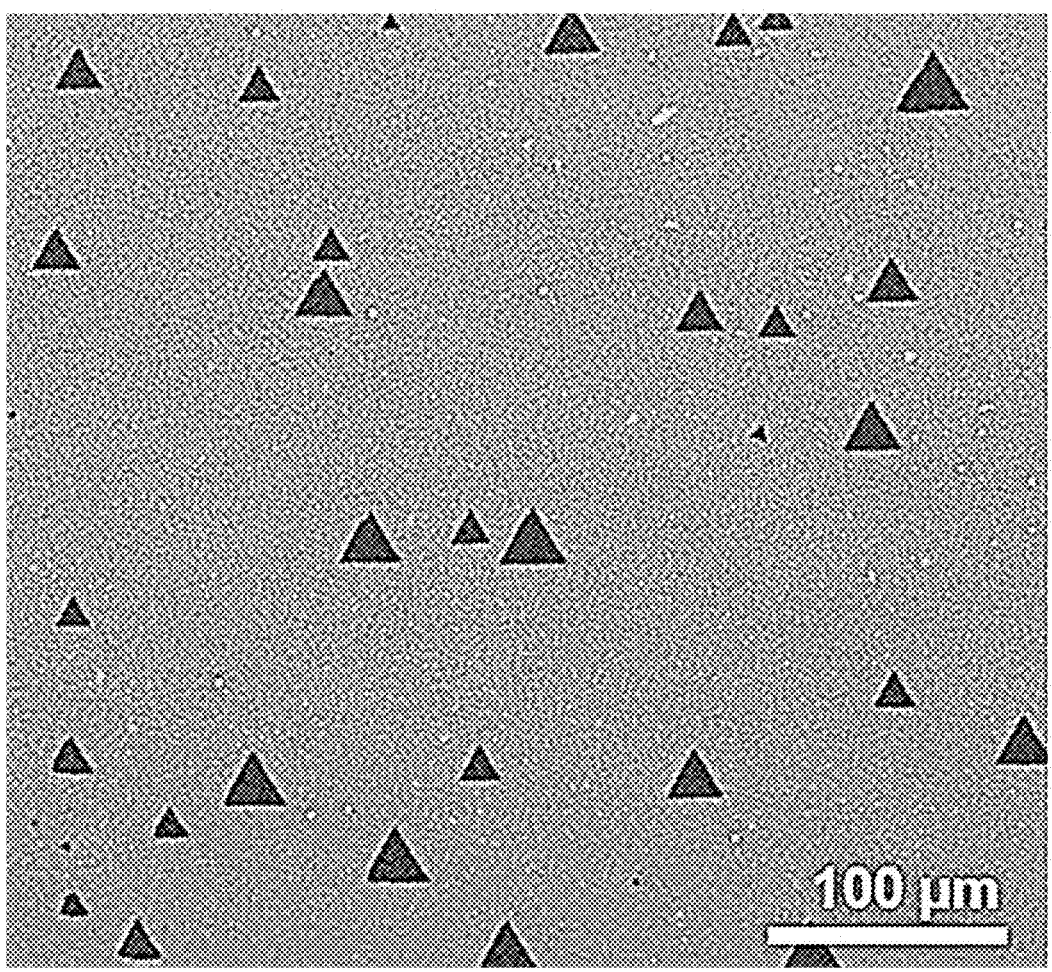
FIG. 9 illustrates a result of observing $MoS_2$ nuclei formed on the h-BN template in the method for growth according to an embodiment of the present invention, by the field emission scanning electron microscope (FE-SEM) in low magnification.

In addition, FIG. 9 illustrates a result that the MoS$_2$ nuclei formed on the h-BN template prepared in Example 4 are observed by the field emission scanning electron microscope (FE-SEM) at a low magnification, and it can be confirmed that a plurality of nuclei formed on the h-BN template the nuclei are uniformly arranged in one direction.

1-2. Raman Spectrum Analysis

Figure 10:
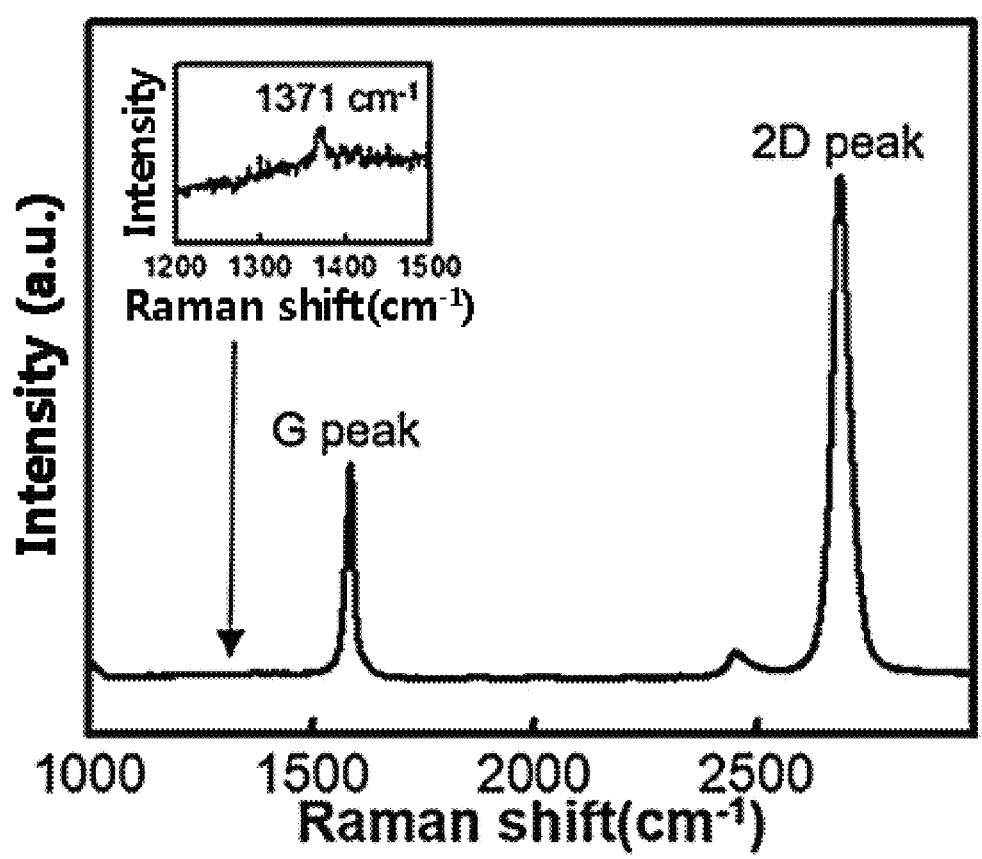
FIG. 10 illustrates a Raman signal graph of graphene and h-BN of a single layer, as a result of Raman spectra of h-BN and graphene heterostructure layers according to an embodiment of the present invention.
Figure 11:
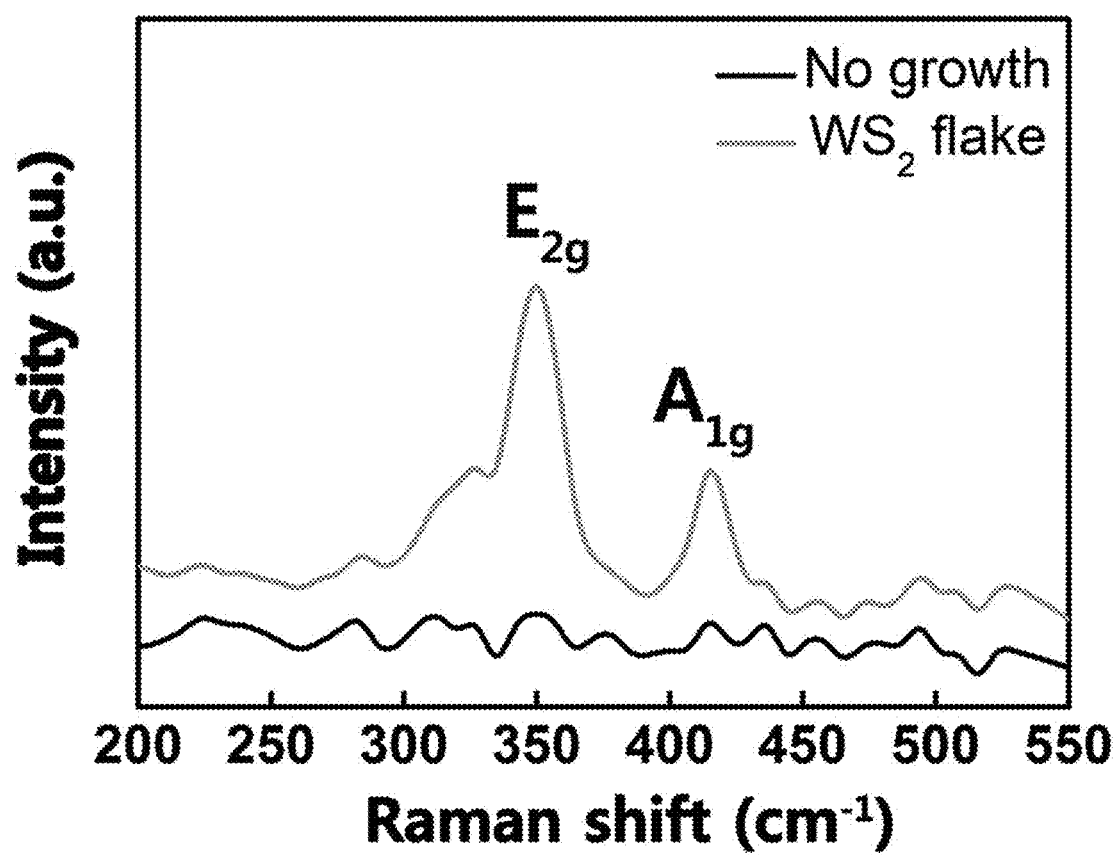
FIG. 11 illustrates a result of observing $WS_2$ prepared according to an embodiment of the present invention, with a Raman spectroscopy, before and after growth on the h-BN template.
Figure 12:
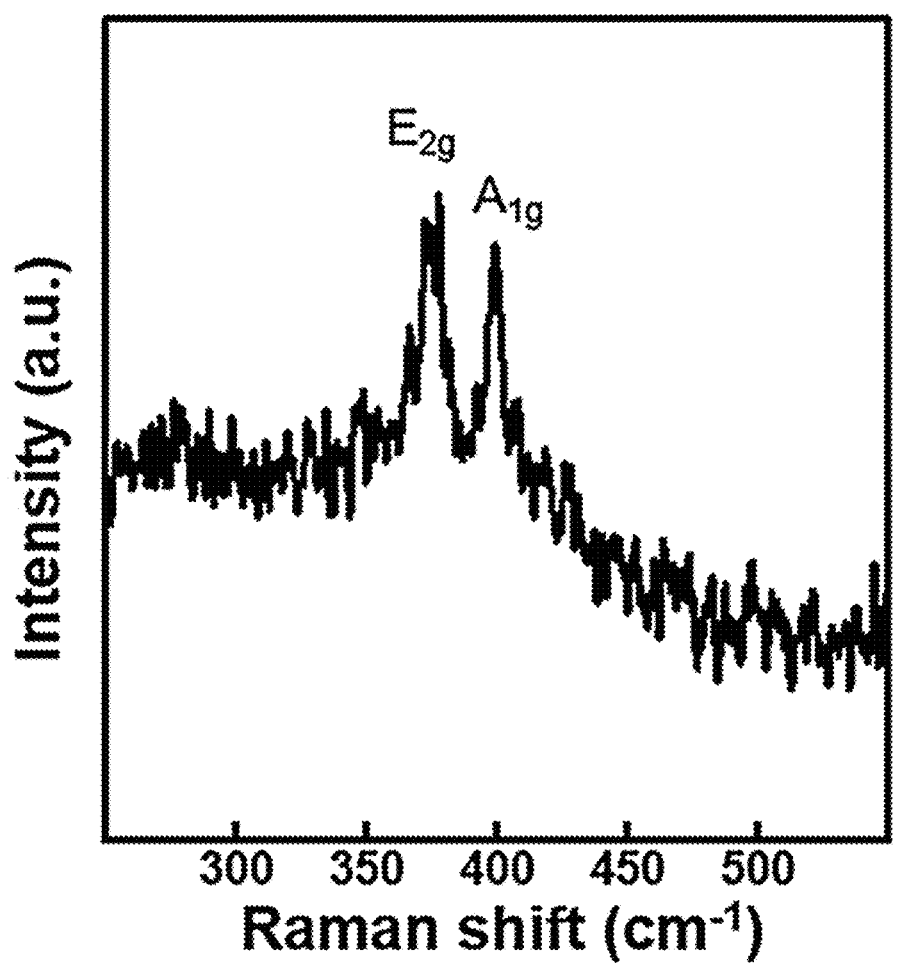
FIG. 12 illustrates a result of observing $MoS_2$ prepared according to an embodiment of the present invention, with the Raman spectroscopy, before and after growth on the h-BN template.

FIGS. 10 to 12 respectively illustrate a result of Raman spectra of h-BN and graphene heterogeneous structure layers in Example 2, a result of being observed by a Raman spectroscopy before and after WS$_2$ prepared in Example 3 is grown in the h-BN template, and a result of being observed before and after MoS$_2$ prepared in Example 4 is grown in the h-BN template.

Therethrough, it can be confirmed that the stacked structure including the single crystalline h-BN template and the heterogeneous structure layer according to the present invention has excellent quality of the single crystal.

1-3. EELS Analysis

Figure 13:
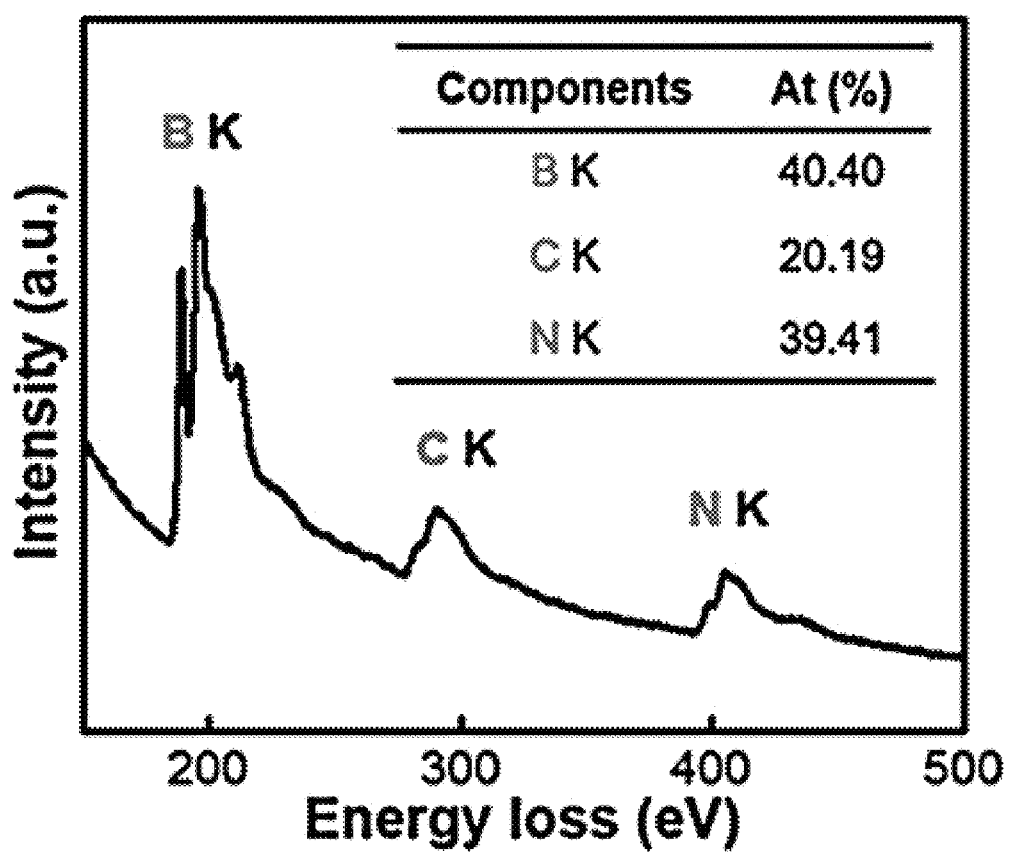
FIG. 13 illustrates binding atoms through a binding structure and an EELS analysis in a stacked structure including a graphene heterogeneous structure layer prepared according to an embodiment of the present invention.

FIG. 13 illustrates binding atoms through a binding structure and an EELS analysis in the stacked structure including the graphene heterogeneous structure layer prepared in Example 2.

Therethrough, it can be confirmed that the stacked structure according to the present invention has excellent quality of the single crystal.

1-4. SAED Analysis

Figure 14:
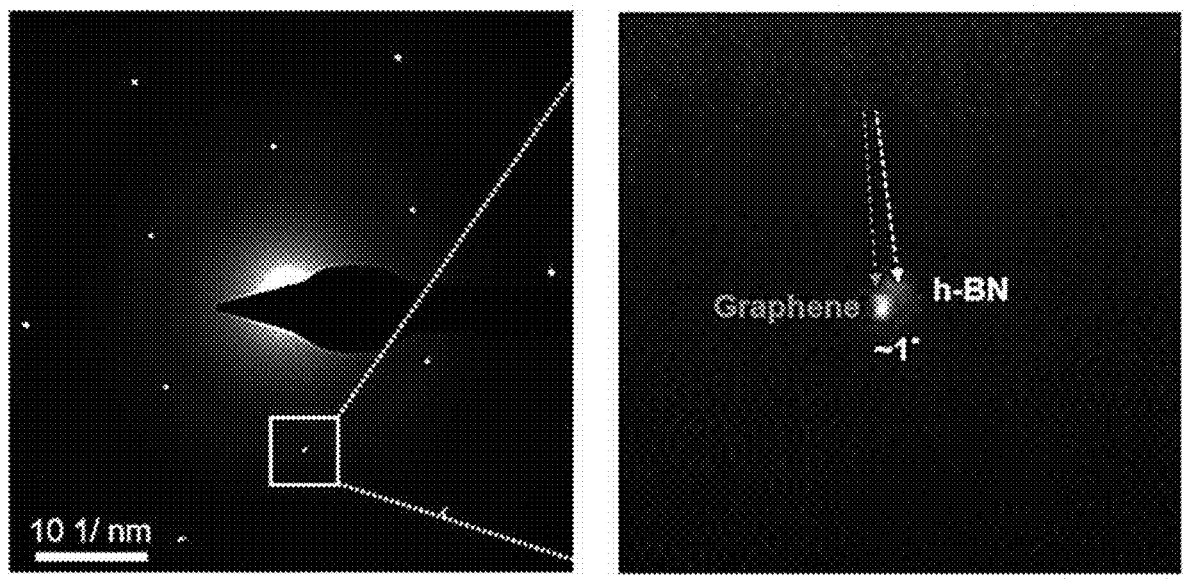
FIG. 14 illustrates that h-BN and graphene have almost identical crystal direction, as a result of measuring h-BN and graphene heterogeneous structures prepared according to an embodiment of the present invention, by a SAED.

FIG. 14 illustrates a result that the h-BN and graphene heterogeneous structures in Example 2 are measured by SAED, and therethrough illustrates that the h-BN template and graphene are almost the same in the crystal direction, and thus a single crystal graphene can be formed.

1-5. HR-TEM Analysis

Figure 15:
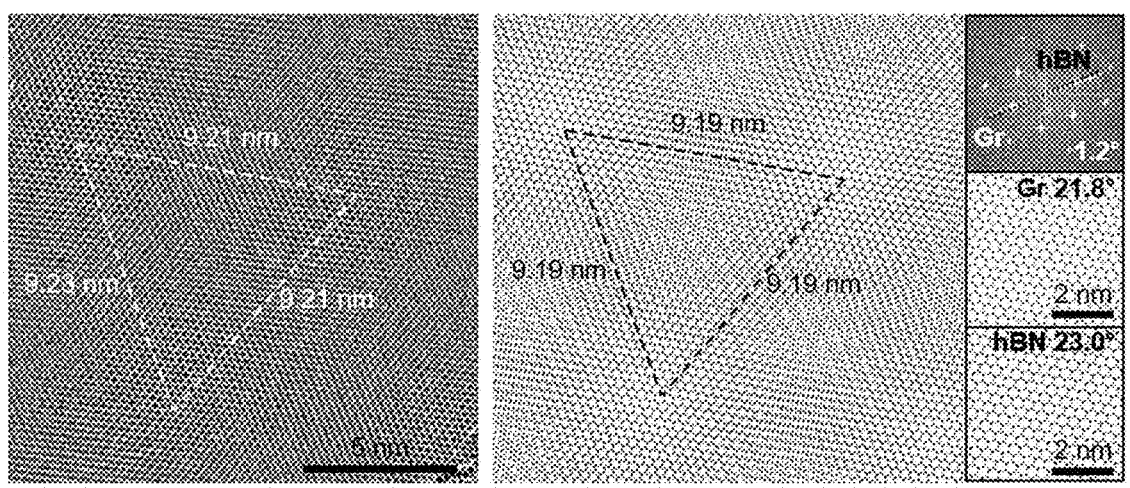
FIG. 15 is a result (left) of observing a stacked form of single crystalline h-BN and graphene heterogeneous structure layers in an embodiment of the present invention, by mean of an HR-TEM, and a theoretical schematic view (right) of an actual rotation angle between h-BN and graphene.

FIG. 15 illustrates a result (left) that a stacked form of a single crystalline h-BN and graphene heterogeneous structure layers in Example 2 is observed by HR-TEM, and a theoretical schematic view (right) of an actual rotation angle between h-BN and graphene.

Comparative Example 1: PET Film Gas/Moisture Blocking Film

A PET film having a thickness of 0.1 mm applied to a conventional gas/moisture blocking film was used.

Comparative Example 2: Gas/Moisture Blocking Film Including Polycrystalline h-BN Temple Polycrystalline h-BN was grown for comparison with single crystalline h-BN. A gold sheet (99.99%+) of iNexus Inc. was used as a growth catalyst of h-BN.

The gold sheet was put in the CVD chamber, the temperature was slowly raised to about 1,050° C. in an atmosphere of argon of 500 sccm and hydrogen of 40 sccm, and then gold sheet was maintained at about 1,050° C. for 1 hour. Borazine was supplied by 0.4 sccm for 1 hour to synthesize a polycrystalline h-BN film.

Example 5: Gas/Moisture Blocking Film Including Single Crystalline h-BN Template The single crystalline h-BN template of Example 1 was transferred onto PET of Comparative Example 1 to prepare a gas/water blocking film.

Experimental Example 2: Gas and Moisture Barrier Characterization Experiment Water vapor transmission rate (WVTR) was measured by using Aquatra Model 2 available from MOCON Inc.

Figure 30:
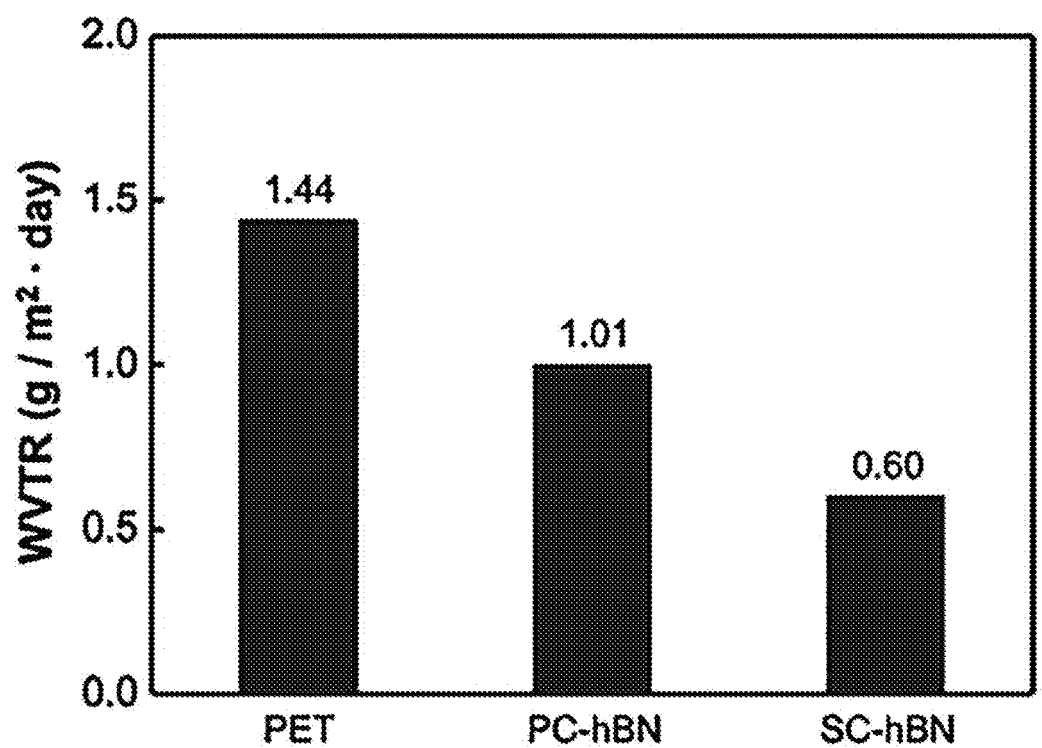
FIG. 30 illustrates a moisture permeability measurement result according to an embodiment of the present invention.

A measurement result is illustrated in FIG. 30, in which it can be confirmed that the gas/moisture blocking film (Example 5) including the single crystalline h-BN template has gas and moisture barrier properties which are superior to those of the PET single film (Comparative Example 1) and the gas/moisture blocking film (Comparative Example 2) including the polycrystalline h-BN template.

The examples of the present invention described above should not be construed as limiting the technical spirit of the present invention. The protection scope of the present invention is limited only by the matters described in the claims, and those skilled in the art can improve and change the technical idea of the present invention in various forms. Therefore, such improvements and modifications will fall within the protection scope of the present invention as long as it will be apparent to those skilled in the art.

In the method for 2D epitaxial growth according to an embodiment of the present invention, the single crystalline heterogeneous structure layer can be formed by forming the heterogeneous structure layer on the h-BN template. Therefore, it can have an advantage of significantly improving electrical properties by inducing the 2D material grown on a surface with epitaxial growth by the h-BN template.

In the method for 2D epitaxial growth according to an embodiment of the present invention, by using the h-BN template as an insulating layer, the heterogeneous 2D material can be grown directly on the h-BN template without a separate transferring process. Accordingly, it can have an advantage of being free from effects of unnecessary impurities and oxidation from the outside.

In the stacked structure according to an embodiment of the present invention, the heterogeneous structure layer can have an AA'-stacked structure on the h-BN template and thus, a 2D stacked structure having a large side size and/or area to a thickness can be prepared.

While the present invention has been described with respect to the specific embodiments, it will be apparent to those skilled in the art that various changes and modifications may be made without departing from the spirit and scope of the invention as defined in the following claims.

What is claimed is:

1. A stacked structure comprising:
   a heat-treated stacked substrate including a second substrate disposed on a first substrate, wherein the heat-treated stacked substrate has been heated above the melting point of the second substrate, and the first substrate has a higher melting temperature than the second substrate;
   a single crystalline h-BN template directly on the second substrate of the heat-treated stacked substrate, the second substrate comprising gold (Au), copper (Cu), iron (Fe), manganese (Mn), nickel (Ni), cobalt (Co), palladium (Pd), titanium (Ti), platinum (Pt), or an alloy thereof, and
   a heterogeneous structure layer,
   wherein the heterogeneous structure layer is a single crystal directly on the h-BN template.

2. The stacked structure according to claim 1, wherein the single crystalline h-BN template and the heterogeneous structure layer are stacked in an AA'-stacking.

3. The stacked structure according to claim 1, wherein the heterogeneous structure layer comprises graphene or a transition metal chalcogenide compound, $MX_2$,
   wherein M comprises titanium (Ti), vanadium (V), zirconium (Zr), niobium (Nb), molybdenum (Mo), technetium (Tc), palladium (Pd), hafnium (Hf), tantalum (Ta), tungsten (W), rhenium (Re), or platinum (Pt) and the X comprises sulfur (S), selenium (Se), or tellurium (Te).

4. The stacked structure according to claim 1, wherein the first substrate is zirconium (Zr), chromium (Cr), vanadium (V), rhodium (Rh), molybdenum (Mo), tantalum (Ta), and tungsten (W), or an alloy thereof.

5. The stacked structure according to claim 3, wherein the first substrate is tungsten, and the heterogeneous structure layer is the transition metal chalcogenide compound, wherein M is molybdenum or tungsten and X is sulfur or oxygen.

\* \* \* \* \*